(12) United States Patent
Jong et al.

(10) Patent No.: US 12,349,454 B2
(45) Date of Patent: Jul. 1, 2025

(54) CHECKERBOARD DUMMY DESIGN FOR EPITAXIAL OPEN RATIO

(71) Applicant: Taiwan Semiconductor Manufacturing Company, Ltd., Hsinchu (TW)

(72) Inventors: Yu-Chang Jong, Hsinchu (TW); Yi-Huan Chen, Hsin Chu (TW); Chien-Chih Chou, New Taipei (TW); Tsung-Chieh Tsai, Chu-Bei (TW); Szu-Hsien Liu, Zhubei (TW); Huan-Chih Yuan, Zhubei (TW); Jhu-Min Song, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 522 days.

(21) Appl. No.: 17/674,084

(22) Filed: Feb. 17, 2022

(65) Prior Publication Data
US 2023/0260994 A1 Aug. 17, 2023

(51) Int. Cl.
*H10D 84/83* (2025.01)
*H10D 84/01* (2025.01)
*H10D 84/03* (2025.01)

(52) U.S. Cl.
CPC ........... *H10D 84/83* (2025.01); *H10D 84/013* (2025.01); *H10D 84/0142* (2025.01); *H10D 84/038* (2025.01)

(58) Field of Classification Search
CPC ........... H01L 27/088; H01L 21/823418; H01L 21/823456; H01L 27/0207; H01L 21/823814; H01L 21/823871; H01L 21/823878; H01L 27/092
See application file for complete search history.

(56) References Cited

U.S. PATENT DOCUMENTS

| | | | |
|---|---|---|---|
| 7,554,110 B2 * | 6/2009 | Yu | H01L 29/045 257/190 |
| 10,026,837 B2 * | 7/2018 | Choi | H10D 84/013 |
| 10,109,628 B2 * | 10/2018 | Murthy | H10D 30/62 |

(Continued)

FOREIGN PATENT DOCUMENTS

| | | | | |
|---|---|---|---|---|
| CN | 113394087 A | * | 9/2021 | ....... H01L 21/28026 |
| CN | 113764339 A | * | 12/2021 | ..... H01L 21/823456 |

(Continued)

*Primary Examiner* — Mohammed Shamsuzzaman
(74) *Attorney, Agent, or Firm* — Eschweiler & Potashnik, LLC

(57) ABSTRACT

Some embodiments relate to an integrated chip structure. The integrated chip structure includes a substrate having a first device region and a second device region. A plurality of first transistor devices are disposed in the first device region and respectively include epitaxial source/drain regions disposed on opposing sides of a first gate structure. The epitaxial source/drain regions have an epitaxial material. A plurality of second transistor devices are disposed in the second device region and respectively include implanted source/drain regions disposed on opposing sides of a second gate structure. A dummy region includes one or more dummy structures. The one or more dummy structures have dummy epitaxial regions including the epitaxial material.

20 Claims, 16 Drawing Sheets

(56) References Cited

U.S. PATENT DOCUMENTS

| | | | |
|---|---|---|---|
| 2006/0270174 A1* | 11/2006 | Chen | H01L 21/266 |
| | | | 257/E21.619 |
| 2008/0135877 A1 | 6/2008 | Inoue et al. | |
| 2009/0042348 A1* | 2/2009 | Yamamoto | H01L 21/823456 |
| | | | 257/E21.624 |
| 2013/0228826 A1* | 9/2013 | Wang | H10D 62/822 |
| | | | 257/E21.409 |
| 2016/0351660 A1* | 12/2016 | Perrin | H01L 21/823878 |
| 2017/0287795 A1 | 10/2017 | Yamamoto et al. | |
| 2021/0159326 A1 | 5/2021 | Hsiao et al. | |
| 2021/0249275 A1* | 8/2021 | Hung | H01L 23/564 |
| 2021/0272988 A1* | 9/2021 | Chen | H01L 27/14683 |
| 2022/0037506 A1* | 2/2022 | Chen | H10D 30/62 |
| 2022/0238521 A1* | 7/2022 | Yang | H01L 21/823481 |
| 2022/0293593 A1* | 9/2022 | Qiaoming | H01L 29/0653 |
| 2023/0154922 A1* | 5/2023 | Yang | H01L 27/0924 |
| | | | 257/369 |
| 2023/0197523 A1* | 6/2023 | Hsu | H01L 21/823412 |
| | | | 257/392 |
| 2023/0197710 A1* | 6/2023 | Hsu | H01L 21/823462 |
| | | | 257/355 |
| 2023/0197718 A1* | 6/2023 | Hsu | H01L 21/823481 |
| | | | 257/401 |
| 2023/0253496 A1* | 8/2023 | Li | H01L 21/823418 |
| | | | 257/192 |
| 2024/0204085 A1* | 6/2024 | Yang | H01L 29/785 |

FOREIGN PATENT DOCUMENTS

| | | | | |
|---|---|---|---|---|
| DE | 102020123708 A1 | * | 9/2021 | H01L 27/14603 |
| JP | 5151303 B2 | * | 2/2013 | H01L 21/823456 |
| JP | 2019046874 A | * | 3/2019 | |

* cited by examiner

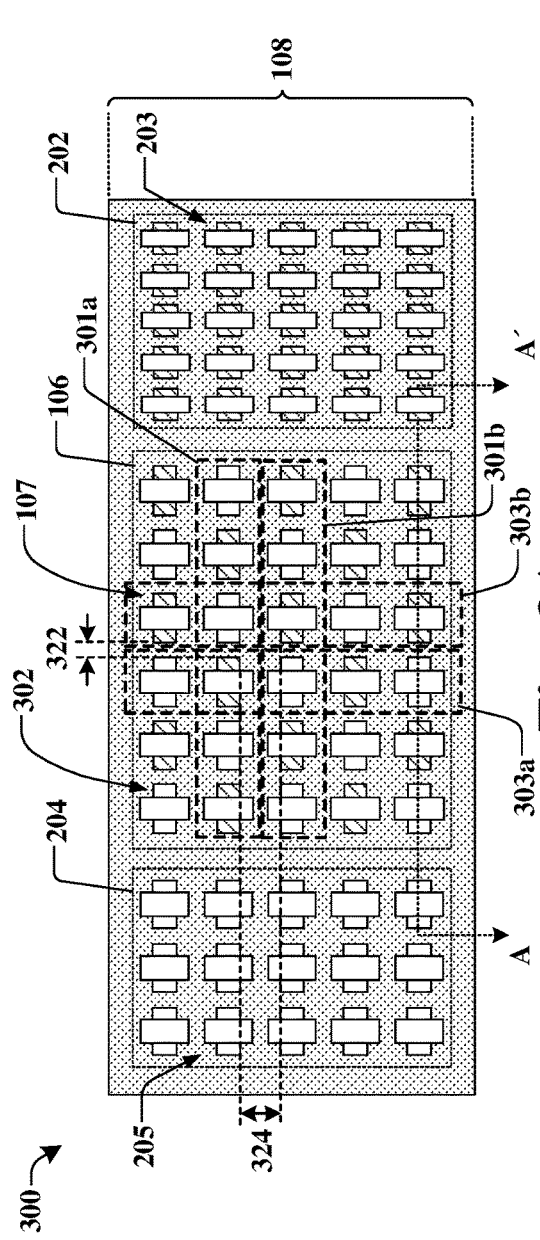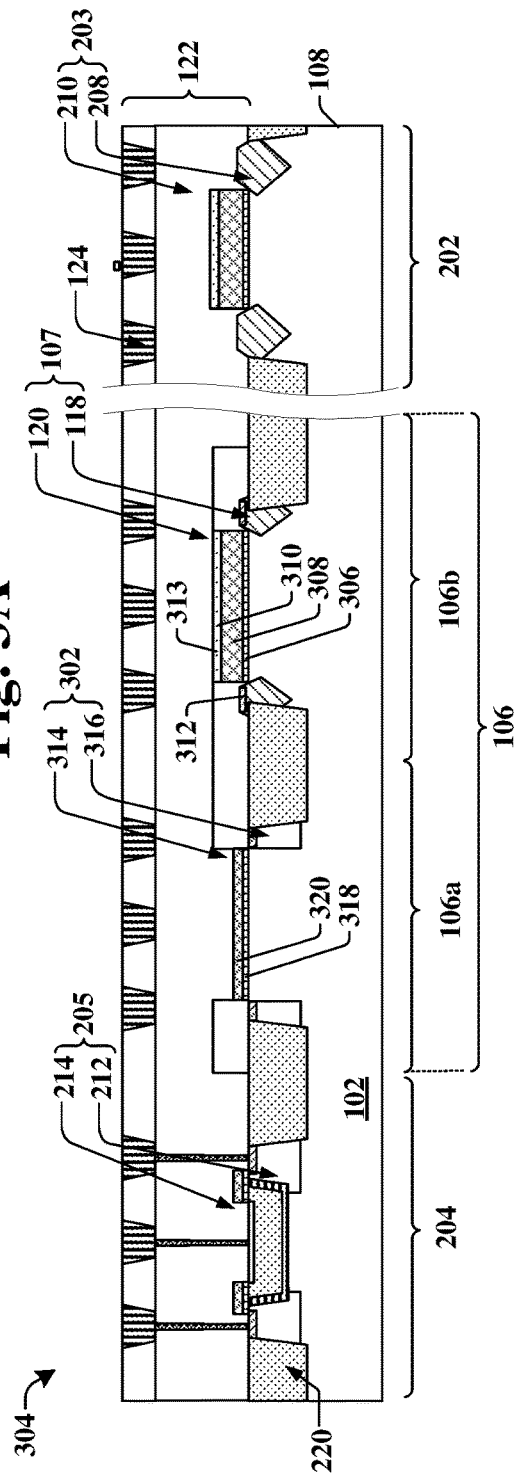
Fig. 3A
Fig. 3B

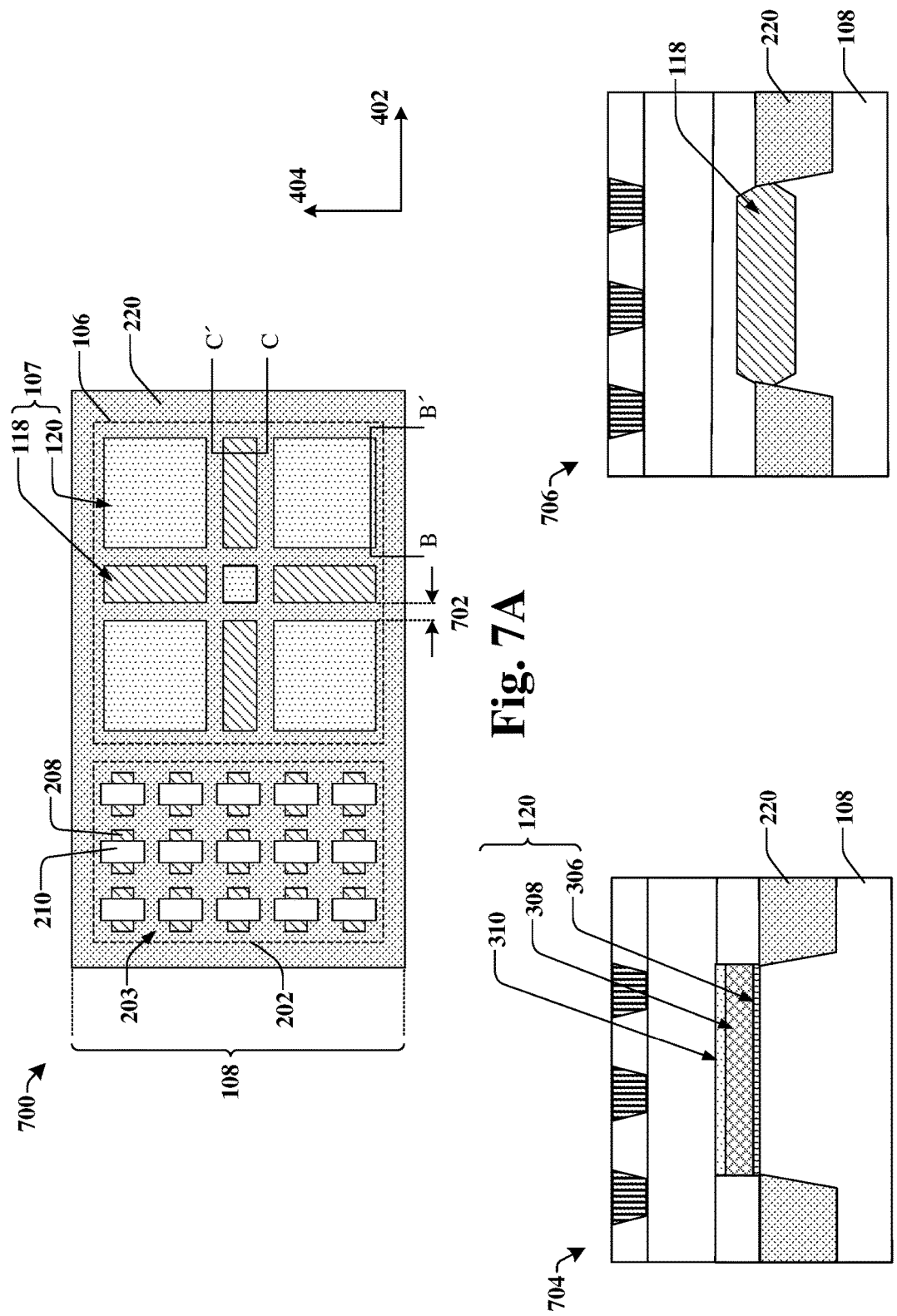

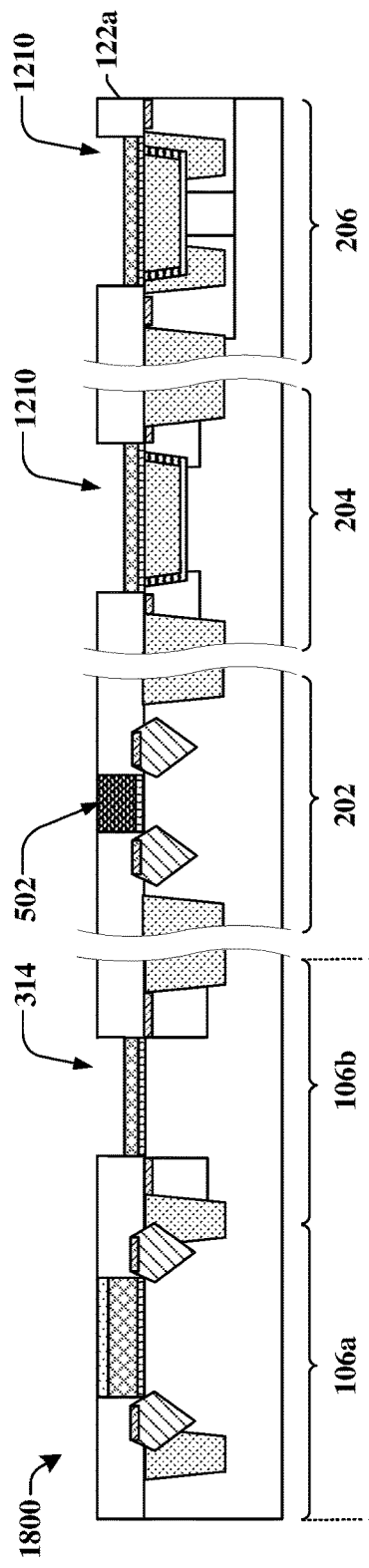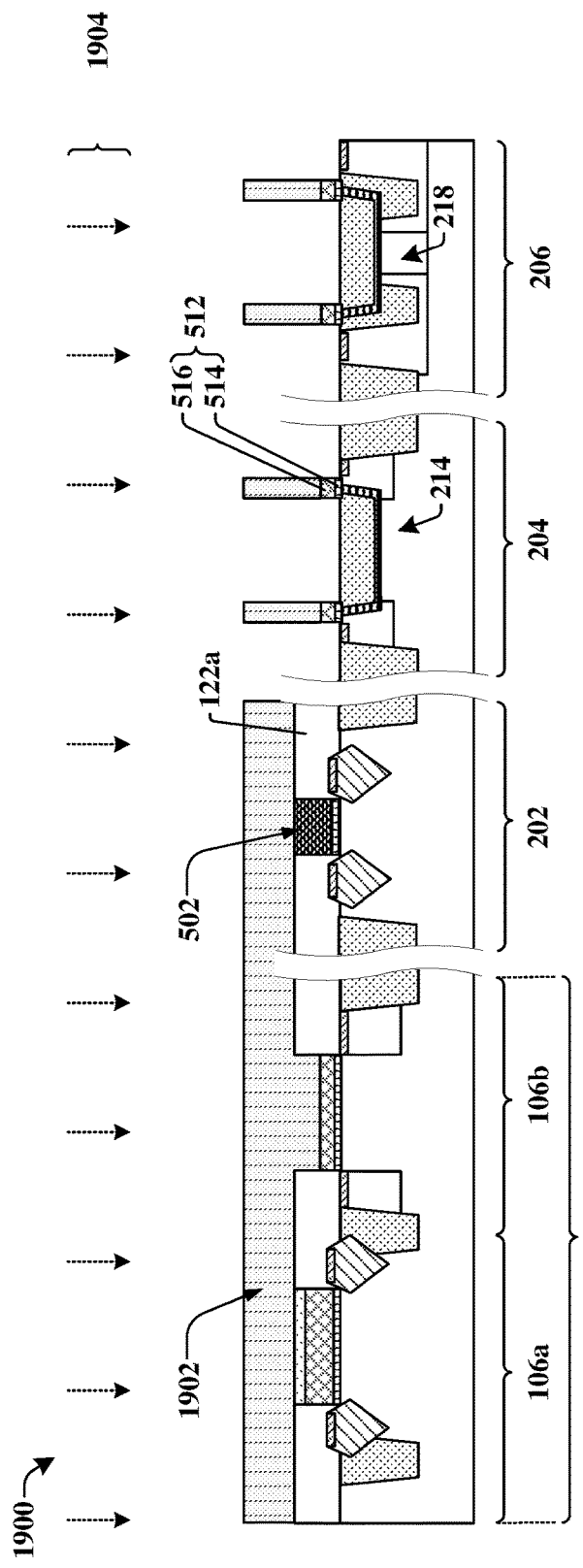
Fig. 18
Fig. 19

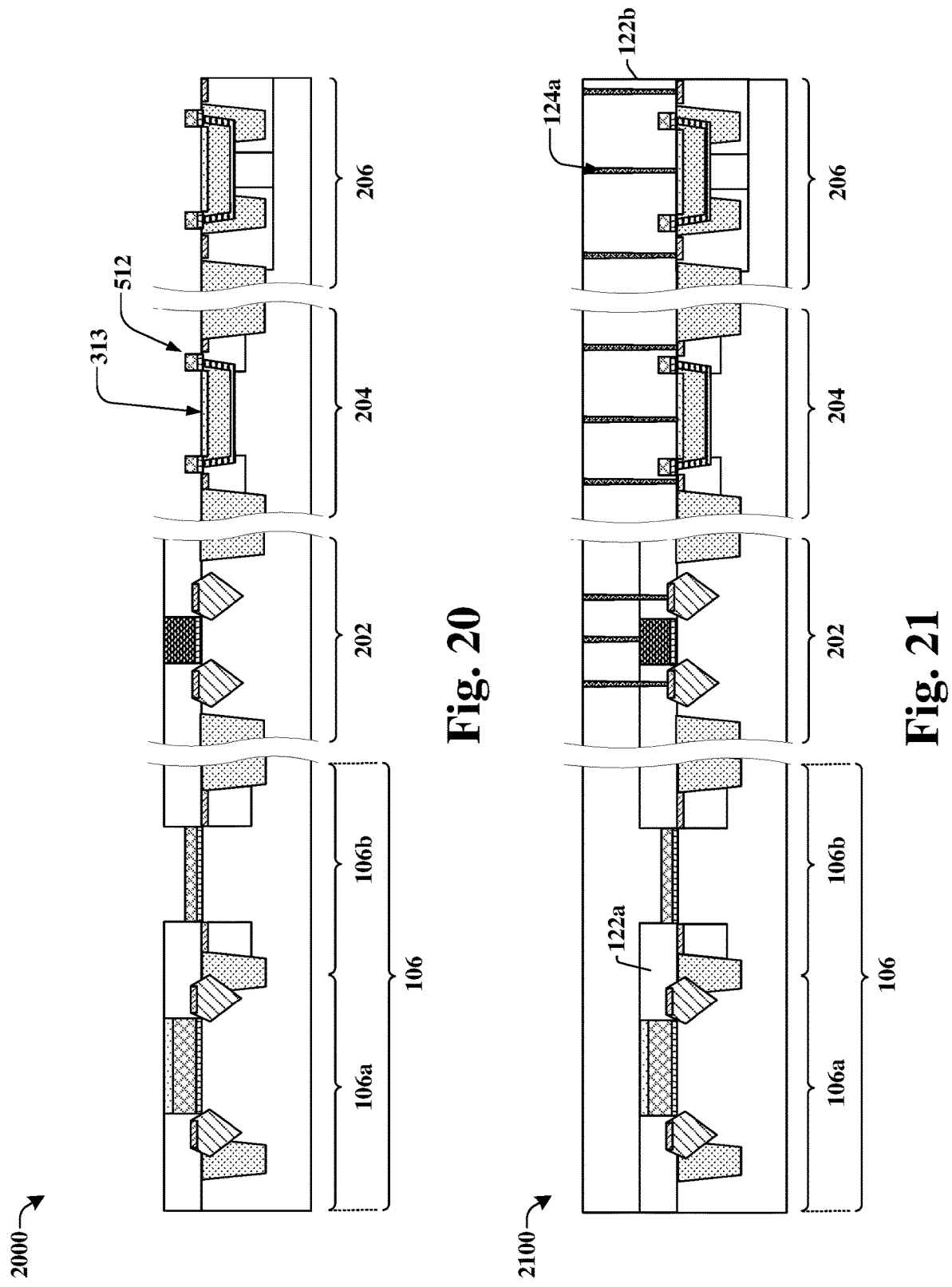

CHECKERBOARD DUMMY DESIGN FOR EPITAXIAL OPEN RATIO

BACKGROUND

Many modern day electronic devices contain transistor devices that operate at different levels of voltage to perform their intended function. Some such electronic devices couple together separate integrated chips respectively having transistor devices that operate at the different voltage levels. Examples of such electronic devices are found in touch and display driver integration (TDDI) and display driver integrated circuit (DDIC) chips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B illustrate some embodiments of an integrated chip structure having a plurality of dummy structures comprising dummy epitaxial regions disposed in a checkerboard pattern within an array.

FIGS. 7A-7C illustrate some additional embodiments of an integrated chip structure having one or more dummy structures comprising dummy epitaxial regions.

FIGS. 10-22 illustrate cross-sectional views of some additional embodiments of a method of forming an integrated chip structure having one or more dummy structures comprising dummy epitaxial regions.

DETAILED DESCRIPTION

Figure 1A:
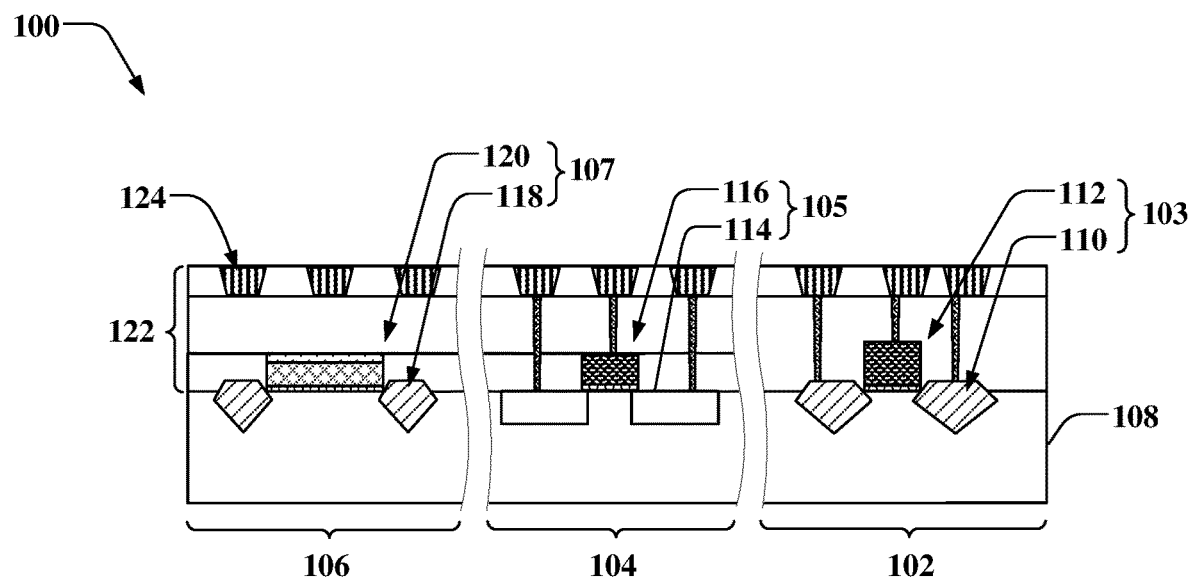
FIGS. 1A-1B illustrate some embodiments of an integrated chip structure having one or more dummy structures comprising dummy epitaxial regions.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chip structures within a single semiconductor body may include a high voltage region comprising high voltage transistor devices, a low voltage region comprising low voltage transistor devices, and a medium voltage region comprising medium voltage transistor devices. The formation of transistor devices having different operating voltages on a single semiconductor body utilizes a variety of different methods of manufacture and designs. For example, low voltage transistor devices may be formed to have epitaxial source/drain regions, while medium and/or high voltage transistor devices may be formed to have implanted source/drain regions.

Typically, epitaxial source/drain regions can be grown without much concern. However, when low-voltage transistor devices are formed on a same integrated chip structure as medium and/or high voltage transistor devices, the low voltage transistor devices may occupy a small amount of a total surface area of the integrated chip structure. Because the low voltage transistor devices occupy a small amount of the total surface area, a pattern density of epitaxial material over the integrated chip structure is relatively low (e.g., less than approximately 5%). It has been appreciated that epitaxial growth processes require a minimum pattern density over an entire integrated chip structure to be formed well. Therefore, a relatively low epitaxial pattern density on integrated chip structures having different transistor device types can lead to poor epitaxial growth, which can lead to performance and/or reliability issues in low voltage transistor devices.

The present disclosure relates to an integrated chip structure that comprises one or more dummy structures having epitaxial regions that are configured to increase an overall epitaxial pattern density of the integrated chip structure. In some embodiments, the integrated chip structure comprises a substrate having a first device region, a second device region, and a dummy region. A plurality of first transistor devices are disposed in the first device region. The plurality of first transistor devices comprise epitaxial source/drain regions disposed on opposing sides of a first gate structure. A plurality of second transistor devices are disposed in the second device region. The plurality of second transistor devices comprise implanted source/drain regions disposed on opposing sides of a second gate structure. One or more dummy structures are arranged in the dummy region. The one or more dummy structures comprise dummy epitaxial regions. By having dummy epitaxial regions within the one or more dummy structures, an overall pattern density of an epitaxial material can be increased (e.g., to greater than or equal to approximately 5.2%) thereby improving a health of an epitaxial growth process used to form the epitaxial source/drain regions within the plurality of first transistor devices. By improving a health of an epitaxial growth process used to form the epitaxial source/drain regions, a performance and/or reliability of the plurality of first transistor devices can be improved.

FIG. 1A illustrates some embodiments of a cross-sectional view of an integrated chip structure 100 having a dummy region comprising one or more dummy structures with one or more dummy epitaxial regions.

The integrated chip structure 100 comprises a plurality of different devices regions 102-106 respectively having different types of devices. In some embodiments, the plurality of different devices regions 102-106 may comprise a first device region 102 having a plurality of first devices 103 that are a first type of device and a second device region 104 having a plurality of second devices 105 that are a second type of device. In some embodiments, the plurality of first devices 103 respectively comprise a first gate structure 112 disposed over a substrate 108 between epitaxial source/drain regions 110 (e.g., silicon germanium (SiGe) source/drain regions). The epitaxial source/drain regions 110 of the plurality of first devices 103 have a first pattern density having a first percentage. The plurality of second devices 105 respectively comprise a second gate structure 116 disposed over the substrate 108 between implanted source/drain regions 114 within the substrate 108. The implanted source/drain regions 114 are a same material as the substrate 108. In some embodiments, the plurality of second devices 105 do not comprise epitaxial source/drain regions (e.g., SiGe), so that the plurality of second devices 105 can be configured to operate at different breakdown voltages than the plurality of first devices 103 and/or to be formed at different costs than the plurality of first devices 103.

The integrated chip structure 100 further comprises a dummy region 106 including one or more dummy structures 107. The one or more dummy structures 107 respectively comprise dummy epitaxial regions 118. In some embodiments, the dummy epitaxial regions 118 comprise and/or are a same epitaxial material as the epitaxial source/drain regions 110. In some embodiments, the epitaxial material may be silicon germanium (SiGe), germanium, silicon carbide (SiC), or other similar materials. In some embodiments, the one or more dummy structures 107 may respectively comprise dummy epitaxial regions 118 disposed on opposing sides of one or more dummy gate structures 120.

One or more conductive interconnects 124 are disposed within a dielectric structure 122 disposed over the substrate 108. The one or more conductive interconnects 124 are electrically coupled to the plurality of first devices 103 and the plurality of second devices 105. The one or more conductive interconnects 124 are electrically isolated from the one or more dummy structures 107. In some embodiments, the dielectric structure 122 completely covers the plurality of dummy structures 107.

Figure 1B:
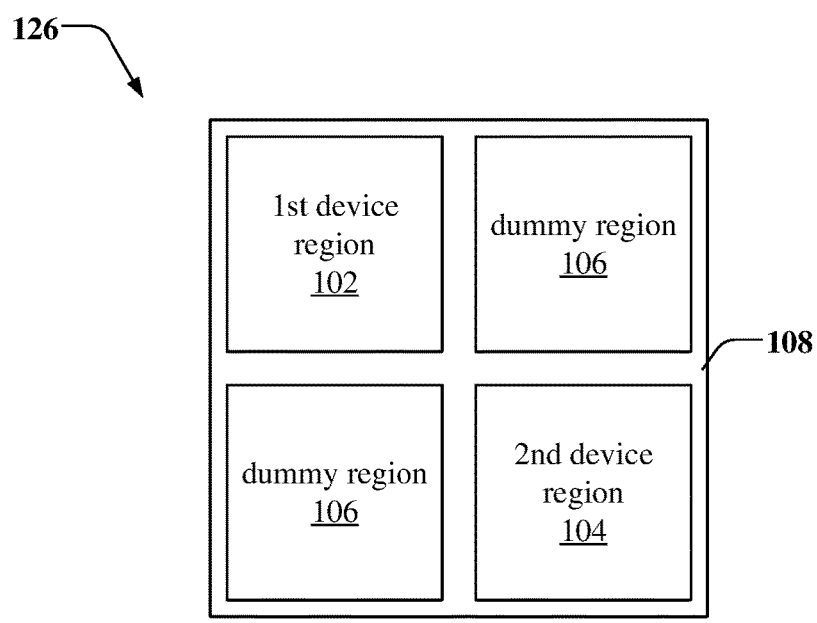

FIG. 1B shows a top-view of some embodiments of a block diagram 126 corresponding to the integrated chip structure 100 of FIG. 1A.

As shown in block diagram 126, the first device region 102, the second device region 104, and the dummy region 106 are separated from one another over the substrate 108. In some embodiments, the dummy region 106 fills in a space that is between the first device region 102 and the second device region 104.

In some embodiments, the first device region 102 may occupy a relatively small surface area of the substrate 108 (e.g., between approximately 5% and approximately 10% of the surface area of the substrate 108). Because the first device region 102 occupies a relatively small surface area of the substrate 108, the first pattern density of the epitaxial material within the first device region 102 may result in the integrated chip structure 100 having an overall pattern density of the epitaxial material that is lower than a minimum epitaxial pattern density that is used in a healthy epitaxial growth process. For example, a healthy epitaxial growth process may use a minimum epitaxial pattern density that is greater than approximately 10%, greater than approximately 7%, greater than approximately 5.2%, or other similar values. Pattern densities that are below the minimum epitaxial pattern density will lead to poor epitaxial growth that can negatively impact a performance and/or a reliability of the plurality of first devices 103. By having a dummy epitaxial region 118 within the dummy region 106, an overall pattern density of the epitaxial material over the integrated chip structure 100 can be increased to a second pattern density that is greater than the minimum epitaxial pattern density. The second pattern density can provide for a healthy epitaxial growth process that results in the plurality of first devices 103 having a good quality of epitaxial source/drain regions 110, which improve a performance and/or a reliability of the plurality of first devices 103.

Figure 2A:
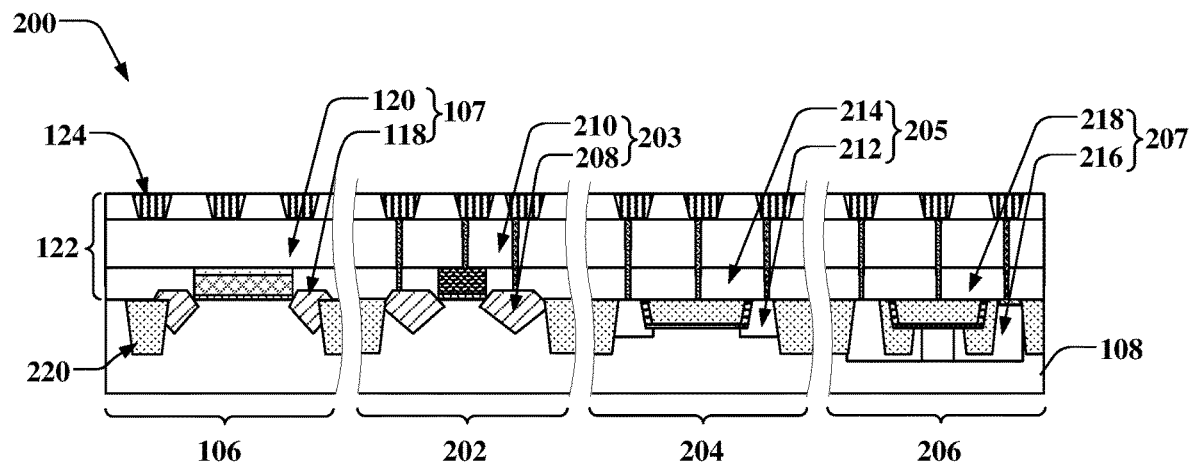
FIGS. 2A-2B illustrate other embodiments of an integrated chip structure having one or more dummy structures comprising dummy epitaxial regions.

FIG. 2A illustrates some embodiments of a cross-sectional view of an integrated chip structure 200 having a dummy region comprising one or more dummy structures with dummy epitaxial regions.

The integrated chip structure 200 includes a substrate 108 having a low voltage device region 202, a medium voltage device region 204, and a high voltage device region 206. The low voltage device region 202 comprises a plurality of low voltage transistor devices 203 respectively comprising a low voltage gate structure 210 disposed between epitaxial source/drain regions 208. The plurality of low voltage transistor devices 203 have a first breakdown voltage. The medium voltage device region 204 comprises a plurality of medium voltage transistor devices 205 respectively comprising a medium voltage gate structure 214 disposed between implanted source/drain regions 212. The plurality of medium voltage transistor devices 205 have a second breakdown voltage that is greater than the first breakdown voltage. The high voltage device region 206 comprises a plurality of high voltage transistor devices 207 respectively comprising a high voltage gate structure 218 disposed between implanted source/drain regions 216. The plurality of high voltage transistor devices 207 have a third breakdown voltage that is greater than the second breakdown.

The integrated chip structure 200 further includes a dummy region 106 having one or more dummy structures 107. The one or more dummy structures 107 respectively comprise dummy epitaxial regions 118. In some embodiments, the dummy epitaxial regions 118 are a same epitaxial material as the epitaxial source/drain regions 208 within the low voltage device region 202. For example, in some embodiments both the dummy epitaxial regions 118 and the epitaxial source/drain regions 208 may comprise and/or be silicon germanium, germanium, silicon carbide, or other similar materials. In some embodiments, the dummy epitaxial regions 118 are disposed within recesses in the substrate 108 and on opposing sides of one or more dummy gate structures 120.

In some embodiments, the low voltage device region 202, the medium voltage device region 204, the high voltage device region 206, and the dummy region 106, are each surrounded by one or more shallow trench isolation (STI) structures 220. In some embodiments, a plurality of conductive interconnects 124 may be disposed within a dielectric structure 122 overlying the substrate 108. The plurality of conductive interconnects 124 may be electrically coupled to the plurality of low voltage transistor devices 203, the plurality of medium voltage transistor devices 205, and the plurality of high voltage transistor devices 207. The conductive interconnects 124 are electrically isolated from the one or more dummy structures 107. In some embodiments, the dielectric structure 122 may comprise a plurality of stacked inter-level dielectric (ILD) layers.

Figure 2B:
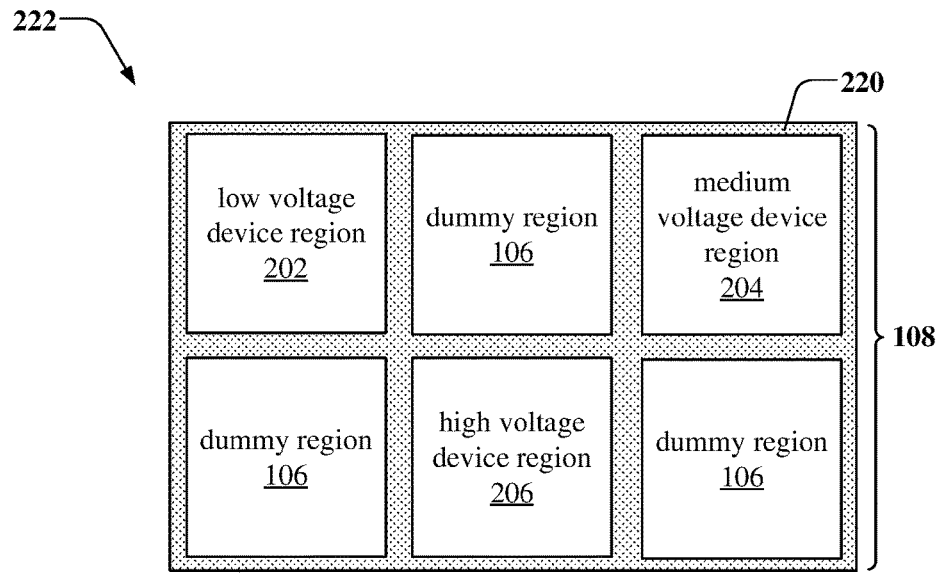

FIG. 2B shows a block diagram 222 of some embodiments corresponding to the integrated chip structure 200 of FIG. 2A.

As shown in block diagram 222, the low voltage device region 202, the medium voltage device region 204, the high voltage device region 206, and the dummy region 106 are separated from one another over the substrate 108. In some embodiments, the dummy region 106 fills in spaces that are between the low voltage device region 202, the medium voltage device region 204, and/or the high voltage device region 206.

FIG. 3A illustrates a top-view of some embodiments of an integrated chip structure 300 having a plurality of dummy structures comprising dummy epitaxial regions disposed in a checkerboard pattern within an array.

The integrated chip structure 300 includes a substrate 108 having a low voltage device region 202 and a medium voltage device region 204. The low voltage device region 202 is arrayed in a first region of the substrate 108, while the medium voltage device region 204 is arrayed in a second region of the substrate 108. A dummy region 106 is between the low voltage device region 202 and the medium voltage device region 204. The dummy region 106 comprises a plurality of dummy structures, 107 and 302, disposed in an array in rows and columns. STI structures 220 surround devices in the low voltage device region 202, the medium voltage device region, and the dummy region 106.

The array of dummy structures comprises one or more dummy structures 107 and one or more additional dummy structures 302. The one or more dummy structures 107 comprise dummy epitaxial regions 118 arranged on opposing sides of one or more dummy gate structures 120. The one or more additional dummy structures 302 comprise dummy doped regions 316 arranged on opposing sides of one or more additional dummy gate structures 314. The one or more dummy structures 107 are separated from one another by the one or more additional dummy structures 302.

In some embodiments, the one or more dummy structures 107 and the one or more additional dummy structures 302 are arranged in a checkerboard pattern. In the checkerboard pattern, adjacent structures within a row and a column vary between the one or more dummy structures 107 and the one or more additional dummy structures 302. For example, a first row 301a of the array comprises a first one of the one or more additional dummy structures 302 laterally surrounded on opposing sides by the one or more dummy structures 107, as viewed in the top-view. Similarly, a first column 303a of the array comprises a first one of the one or more additional dummy structures 302 vertically surrounded on opposing sides by the one or more dummy structures 107, as viewed in the top-view.

In some embodiments, the checkerboard pattern may comprise an array of dummy epitaxial regions 118 and one or more dummy gate structures 120 arranged in a plurality of rows and a plurality of columns. For example, a first row 301a and/or a first column 303a may alternate between one of the dummy epitaxial regions 118 and one of the one or more dummy gate structures 120 and a closest neighboring second row 301b and/or second column 303b may alternate between one of the dummy epitaxial regions 118 and one of the one or more dummy gate structures 120. The dummy epitaxial regions 118 in the first row 301a are laterally offset from the dummy epitaxial regions 118 in the closest neighboring second row 301b by a first non-zero distance 322. Similarly, the dummy epitaxial regions 118 in the first column 303a are vertically offset from the dummy epitaxial regions 118 in the closest neighboring second column 303b by a second non-zero distance 324.

FIG. 3B illustrates a cross-sectional view 304 corresponding to some embodiments of the integrated chip structure 300 shown in FIG. 3A. Cross-sectional view 304 is taken along line A-A' of FIG. 3A.

As shown in cross-sectional view 304, the low voltage device region 202 comprises a plurality of low voltage transistor devices 203 respectively comprising a low voltage gate structure 210 disposed between epitaxial source/drain regions 208. The medium voltage device region 204 comprises a plurality of medium voltage transistor devices 205 respectively comprising a medium voltage gate structure 214 disposed between implanted source/drain regions 212.

The dummy region 106 comprises a first dummy region 106a comprising one or more dummy structures 107 and a second dummy region 106b comprising one or more additional dummy structures 302. The one or more dummy structures 107 comprise one or more dummy gate structures 120 disposed between dummy epitaxial regions 118. In some embodiments, the one or more dummy gate structures 120 comprise a first dielectric layer 306, a second dielectric layer 308, and a polysilicon layer 310. The one or more additional dummy structures 302 comprise one or more additional dummy gate structures 314 disposed between dummy doped regions 316. In some embodiments, the one or more additional dummy gate structures 314 comprise a third dielectric layer 318 and a fourth dielectric layer 320.

In some embodiments, the second dielectric layer 308 may have a greater maximum thickness than the fourth dielectric layer 320. In some embodiments, the first dielectric layer 306 and the third dielectric layer 318 may have thicknesses that are in a range of between approximately 80 angstroms and approximately 120 angstroms, approximately 100 angstroms, or other similar values. In some embodiments, the second dielectric layer 308 has a thickness that is in a range of between approximately 400 angstroms and approximately 500 angstroms, that is approximately 450 angstroms, or other similar values. In some embodiments, the fourth dielectric layer 320 has a thickness that is in a range of between approximately 175 angstroms and approximately 225 angstroms, that is approximately 200 angstroms, or other similar values. In some embodiments, the polysilicon layer 310 has a thickness that is in a range of between approximately 125 angstroms and approximately 175 angstroms, that is approximately 150 angstroms, or other similar values. A first silicide 312 is arranged on top surfaces of the one or more dummy epitaxial regions 118. The one or more dummy epitaxial regions 118 extend out of a top surface of the substrate 108 and over the STI structures 220.

In some embodiments, the one or more dummy gate structures 120 have a height that is substantially the same as the low voltage gate structure 210. In such embodiments, the one or more dummy gate structures 120 are able to mitigate dishing in chemical mechanical planarization (CMP) processes, and thereby improve a flatness of inter-level dielectric (ILD) layers within the low voltage device region 202 and the dummy region 106. The improved flatness of ILD layers improves subsequent photolithography processes. However, it has been appreciated that the one or more dummy structures 107 may induce problematic charge coupling between the polysilicon layer 310 and the conductive interconnects 124.

The checkerboard pattern provides the dummy region 106 with both one or more dummy structures 107 and one or more additional dummy structures 302. Because the one or more dummy structures 107 have dummy epitaxial regions 118, the one or more dummy structures 107 increase an overall pattern density of epitaxial material within the integrated chip structure 300, thereby improving the formation of epitaxial source/drain regions within the low voltage device region 202. The polysilicon layer 310 of the one or more dummy structures 107 also provides for a resistance to CMP dishing (e.g., that may occur during a high k metal gate replacement process used to form the lower voltage devices), thereby providing for a greater flatness of an ILD layer. The one or more additional dummy gate structures 314 do not have a polysilicon layer along a top of the one or more additional dummy gate structures 314, and therefore increase a distance between the one or more additional dummy gate structures 314 and overlying conductive interconnects 124. By increasing the distance between the one or more additional dummy gate structures 314 and the overlying conductive interconnects 124, the charge coupling is reduced. Therefore, the checkerboard pattern is able to provide both an improved epitaxial (e.g., SiGe) formation and an improved ILD flatness without significantly degrading charge coupling.

Figure 4A:
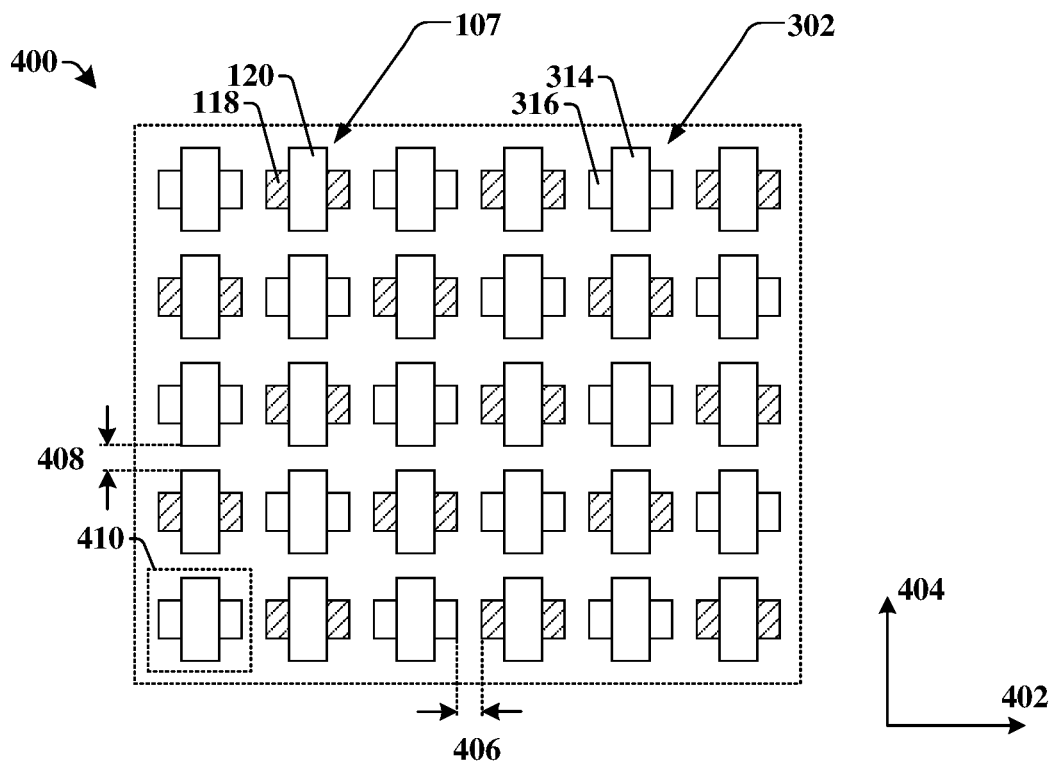
FIGS. 4A-4B illustrate some embodiments of an integrated chip structure having a plurality of dummy structures comprising dummy epitaxial regions disposed in a checkerboard pattern within an array.

FIG. 4A shows a top-view 400 of the embodiments of an integrated chip structure having dummy structures comprising dummy epitaxial regions disposed in a checker board pattern within an array.

As shown in top-view 400, an array of dummy structures comprises one or more dummy structures 107 and one or more additional dummy structures 302. The one or more dummy structures 107 comprise one or more dummy gate structures 120 disposed between dummy epitaxial regions 118. The one or more additional dummy structures 302 comprise one or more additional dummy gate structures 314 disposed between dummy doped regions 316 within a substrate 108. The array comprises a checkerboard pattern that alternates between the one or more dummy structures 107 and the one or more additional dummy structures 302 along rows extending in a first direction 402 and along columns extending in a second direction 404. In some embodiments, adjacent dummy structures within a row are separated from one another by a first distance 406 and adjacent dummy structures within a column are separated from one another by a second distance 408. In some embodiments, the first distance 406 and the second distance 408 are in a range of between approximately 0.1 microns (μm) and approximately 0.8 μm, between approximately 0.2 μm and approximately 0.6 μm, approximately 0.4 μm, or other similar values.

Figure 4B:
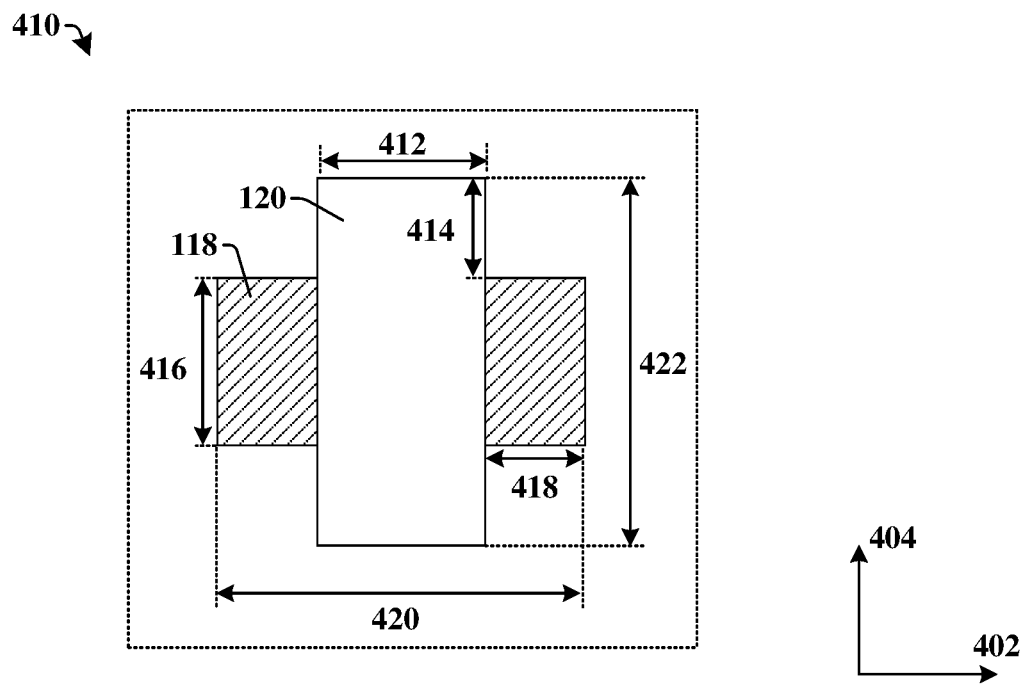

FIG. 4B illustrates a top-view of some embodiments of a part 410 of the array of dummy structures shown in FIG. 4A.

As shown in the top-view of FIG. 4B, the one or more dummy structures 107 have a maximum width 420 extending between outermost edges of the one or more dummy epitaxial regions 118 facing away from the one or more dummy gate structures 120 and a maximum height 422 extending between outermost edges of the one or more dummy gate structures 120 along a length of the one or more dummy gate structures 120. In some embodiments, the maximum width 420 and the maximum height 422 may be in a range of between approximately 0.5 μm and approximately 1.5 μm, between approximately 0.6 μm and approximately 1 μm, approximately 0.8 μm, or other similar values In some embodiments, the one or more dummy gate structures 120 may have a width 412 that is in a range of between approximately 0.3 μm and approximately 0.5 μm, between approximately 0.4 μm and approximately 0.5 μm, 0.4 μm, or other similar values. In some embodiments, the one or more dummy gate structures 120 may extend a first distance 414 past the dummy epitaxial regions 118. In some embodiments, the first distance 414 is in a range of between approximately 0.3 μm and approximately 0.5 μm, between approximately 0.4 μm and approximately 0.5 μm, 0.4 μm, or other similar values. In some embodiments, the dummy epitaxial regions 118 may have a width 418 extending in the first direction 402 and a height 416 extending in the second direction 404. In some embodiments, the width 418 may be approximately 4 μm and the height 416 may be approximately 0.8 μm.

Figure 5:
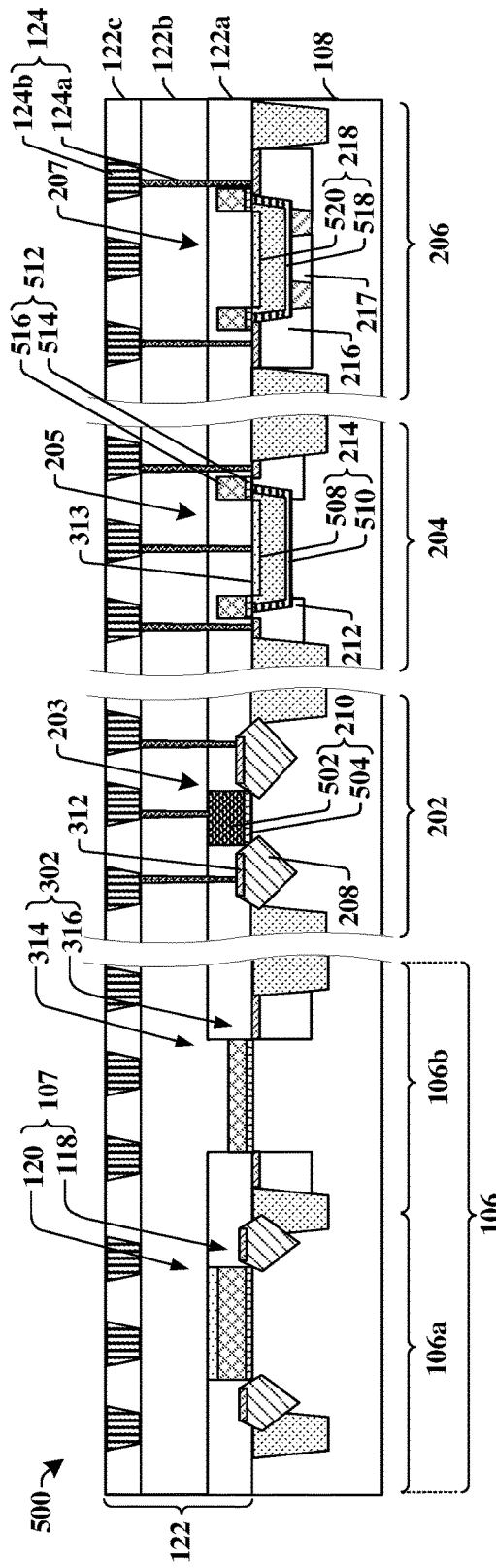
FIG. 5 illustrates a cross-sectional view of some additional embodiments of an integrated chip structure having one or more dummy structures comprising dummy epitaxial regions.

FIG. 5 illustrates some additional embodiments of an integrated chip structure 500 having dummy structures comprising dummy epitaxial regions.

The integrated chip structure 500 comprises a substrate 108 having a low voltage device region 202 comprising a plurality of low voltage transistor devices 203, a medium voltage device region 204 comprising a plurality of medium voltage transistor devices 205, a high voltage device region 206 comprising a plurality of high voltage transistor devices 207, and a dummy region 106 having one or more dummy structures 107.

The plurality of low voltage transistor devices 203 have a low voltage gate structure 210 between epitaxial source/drain regions 208. In some embodiments, the low voltage gate structure 210 comprises a metal gate electrode 502 directly over a low voltage gate dielectric 504. The metal gate electrode 502 may comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), or other suitable materials. A first silicide 312 is disposed on uppermost surfaces of the epitaxial source/drain regions 208. In some embodiments, the low voltage transistor devices 203 are over a lightly doped well (not shown).

The plurality of medium voltage transistor devices 205 comprise a medium voltage gate structure 214 that is recessed within the substrate 108 and positioned directly between implanted source/drain regions 212. In some embodiments, the medium voltage gate structure 214 comprises a gate dielectric 510 and a gate electrode 508, with the gate dielectric 510 surrounding sidewalls of the gate electrode 508. The plurality of medium voltage transistor devices 205 also comprise the first silicide 312 on top surfaces of the implanted source/drain regions 212 and a second silicide 313 on the gate electrode 508.

The plurality of high voltage transistor devices 207 comprise a high voltage gate structure 218 that is disposed within a recess within the substrate 108 and positioned directly between implanted source/drain regions 216. In some embodiments, the high voltage gate structure 218 comprises a gate dielectric 518 and a gate electrode 520, with the gate dielectric 518 surrounding sidewalls of the gate electrode 520. The plurality of high voltage transistor devices 207 also each have the first silicide 312 on top surfaces of the implanted source/drain regions 216. In some embodiments, the plurality of high voltage transistor devices 207 further comprise STI structures 220 directly beneath the high voltage gate structure 218. In some embodiments, the plurality of high voltage transistor devices 207 further comprise an additional doped region 217 between the STI structures 220 directly beneath the high voltage gate structure 218.

Conductive interconnects 124 are disposed within a dielectric structure 122 over the substrate 108. In some embodiments, the conductive interconnects 124 may comprise a conductive material such as copper, aluminum, tungsten, or the like. In some embodiments, the dielectric structure 122 may comprise a plurality of ILD layers 122a-122c stacked onto one another. In various embodiments, the plurality of ILD layers 122a-122c may comprise one or more of silicon dioxide, carbon doped silicon oxide (SiCOH), phosphosilicate glass (PSG), borophosphosilicate glass (BPSG), fluorosilicate glass (FSG), undoped silicate glass (USG), or the like. In some embodiments, the conductive interconnects 124 may comprise a first plurality of conductive interconnects 124a within a first ILD layer 122a and/or a second ILD layer 122b and a second plurality of conductive interconnects 124b within a third ILD layer 122c. In some embodiments, the first plurality of conductive interconnects 124a may be conductive contacts and the second plurality of conductive interconnects 124b may be conductive wires.

In some embodiments, a protective stack 512 covers outer edges of the medium voltage gate structure 214 and/or the high voltage gate structure 218. The protective stack 512 comprises a first protective stack dielectric layer 514 and a second protective stack dielectric layer 516 over the first protective stack dielectric layer 514. In some embodiments, the first protective stack dielectric layer 514 may comprise silicon oxide, silicon nitride, silicon carbide, etc., and the second protective stack dielectric layer 516 may comprise silicon nitride, silicon carbide, etc. In various embodiments, the protective stack 512 may be configured to act as a chemical mechanical polishing (CMP) barrier and/or to block salicidation of parts of the medium voltage gate structure 214 and the high voltage gate structure 218.

In some embodiments, the source/drain regions 212 and 216 are doped with a doping concentration of $1E15/cm^3$ to $1E17/cm^3$, though other ranges of values are also within the scope of this disclosure. The gate dielectrics 510 and 518 comprise silicon oxide, silicon carbide, etc., and in some embodiments have a thickness between approximately 100 angstroms and approximately 200 angstroms. The gate electrodes 508 and 520 comprise polysilicon and have a thickness between approximately 700 angstroms and approximately 1000 angstroms. The first silicide 312 and the second silicide 313 may comprise titanium silicide, cobalt silicide, nickel silicide, or other suitable materials.

Figure 6:
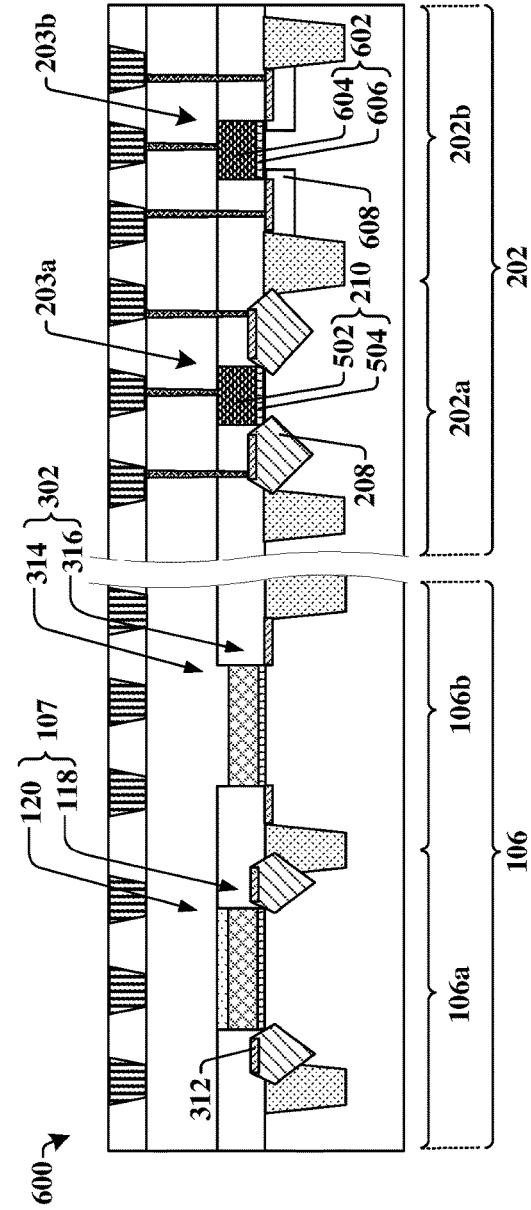
FIG. 6 illustrates a cross-sectional view of both PMOS and NMOS low voltage transistor devices that may be present in an integrated chip structure having one or more dummy structures comprising dummy epitaxial regions.

FIG. 6 illustrates some additional embodiments of an integrated chip structure 600 having dummy structures comprising dummy epitaxial regions.

The integrated chip structure 600 includes a substrate 108 having a low voltage device region 202 comprising a plurality of low voltage transistor devices 203a-203b and a dummy region 106 having one or more dummy structures 107 and one or more additional dummy structures 302. The low voltage device region 202 comprises a first low voltage device region 202a having a first low voltage transistor device 203a that is a first device type (e.g., an NMOS device) and a second low voltage device region 202b having a second low voltage transistor device 203b that is a second device type (e.g., a PMOS device). The first low voltage transistor device 203a comprises a low voltage gate structure 210 disposed between epitaxial source/drain regions 208. The second low voltage transistor device 203b comprises a second low voltage gate structure 602 disposed between implanted source/drain regions 608 comprising a same material as the substrate 108. In some embodiments, the second low voltage gate structure 602 comprises a second low voltage gate electrode 604 separated from the substrate 108 by a second low voltage gate dielectric 606.

The dummy region 106 comprises one or more dummy structures 107 having one or more dummy gate structures 120 disposed between dummy epitaxial regions 118 comprising a same material as the epitaxial source/drain region 208, so that the dummy epitaxial regions 118 are a same material as the epitaxial source/drain regions 208 of the first low voltage transistor device 203a and different than the implanted source/drain regions 608 of the second low voltage transistor device 203b.

FIG. 7A illustrates a top-view of some additional embodiments of an integrated chip structure 700 having one or more dummy structures comprising dummy epitaxial regions.

The integrated chip structure 700 comprises a substrate 108 including a low voltage device region 202 having a plurality of low voltage transistor devices 203 and a dummy region 106 having one or more dummy structures 107. The one or more dummy structures 107 respectively comprise one or more dummy gate structures 120 and dummy epitaxial regions 118. In some embodiments, the one or more dummy gate structures 120 are interleaved between two or more of dummy epitaxial regions 118. In some additional embodiments, the dummy epitaxial regions 118 are interleaved between two or more dummy gate structures. In some embodiments, the one or more dummy gate structures 120 are separated from the one or more dummy epitaxial regions 118 by a first distance 702 measured along a first direction 402. In some embodiments, one or more of the one or more dummy gate structures 120 and/or the dummy epitaxial regions 118 continuously extend in a second direction 404 past multiple ones of the plurality of low voltage transistor devices 203. The first direction 402 is perpendicular to the second direction 404.

In some embodiments, the one or more dummy gate structures 120 and the dummy epitaxial regions 118 are disposed in a plurality of rows and a plurality of columns. A first row and/or a first column may alternate between one of the dummy epitaxial regions 118 and one of the one or more dummy gate structures 120 and a closest neighboring second row and/or column may alternate between one of the dummy epitaxial regions 118 and one of the one or more dummy gate structures 120. The dummy epitaxial regions 118 in the first row are laterally offset from the dummy epitaxial regions 118 in the closest neighboring second row by a first non-zero distance. Similarly, the dummy epitaxial regions 118 in the first column are vertically offset from the dummy epitaxial regions 118 in the closest neighboring second column by a second non-zero distance.

In some embodiments, the one or more dummy gate structures 120 and dummy epitaxial regions 118 do not overlap in order to maximize a surface area of the dummy epitaxial regions 118 that is available for epitaxial growth. In some embodiments, the dummy epitaxial regions 118 of the one or more dummy structures 107 have a top surface entirely composed of an epitaxial material (e.g., SiGe). In some embodiments, the one or more dummy gate structures 120 and the dummy epitaxial regions 118 are spaced from one another by one or more STI structures 220. In such embodiments, the dummy epitaxial regions 118 are disposed on surfaces of the substrate 108. Due to the increased surface area of the dummy epitaxial regions 118, the one or more dummy structures 107 have a high epitaxial pattern density that leads to a higher overall epitaxial pattern density for the integrated chip structure 700 and a healthier epitaxial growth process and better reliability for the low voltage transistor devices 203.

FIG. 7B shows a cross-sectional view 704 of one or more dummy gate structures 120 taken along a cut at line B-B' of FIG. 7A. As shown in cross-sectional view 704, the one or more dummy gate structures 120 comprise a first dielectric layer 306, a second dielectric layer 308, and a polysilicon layer 310. In some embodiments, the one or more dummy gate structures 120 have a height substantially a same as the height of the low voltage gate structures 210 of the plurality of low voltage transistor devices 203. This leads to a better ILD flatness and reduces dishing in CMP processes.

FIG. 7C shows a cross-sectional view 706 of the dummy epitaxial regions 118 taken along a cut at line C-C' of FIG. 7A. As shown in cross-sectional view 706, the dummy epitaxial regions 118 are disposed on a surface of the substrate 108 that is between STI structures 220.

Figure 8A:
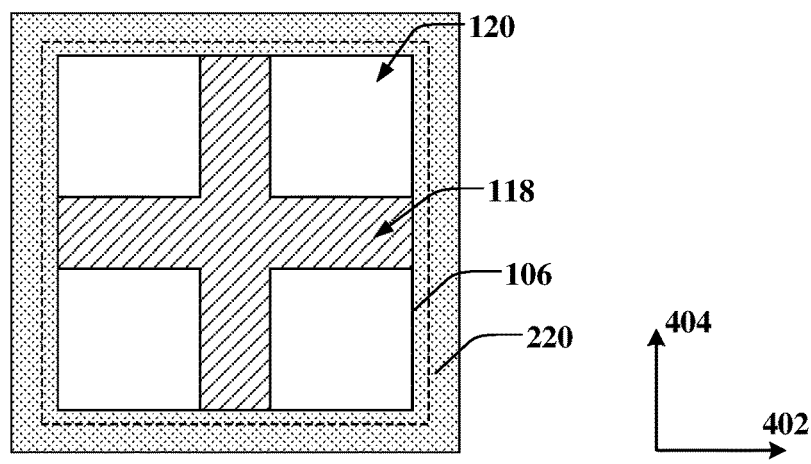
FIGS. 8A-8C illustrate some additional embodiments of an integrated chip structure having one or more dummy structures comprising dummy epitaxial regions.
Figure 8B:
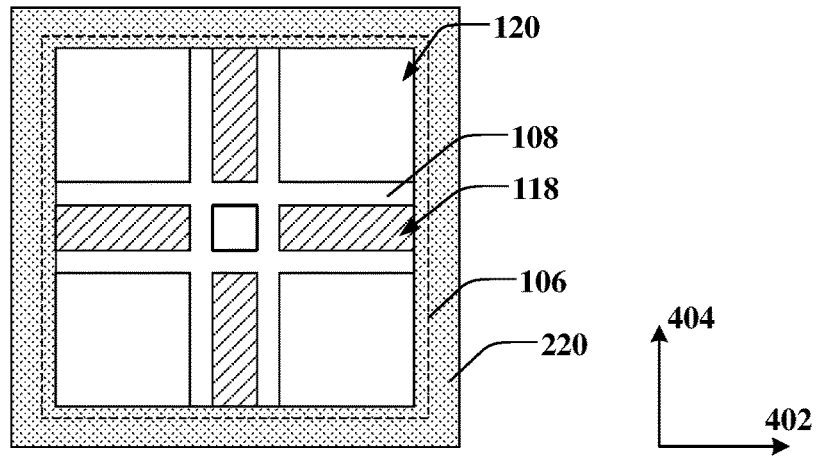
Figure 8C:
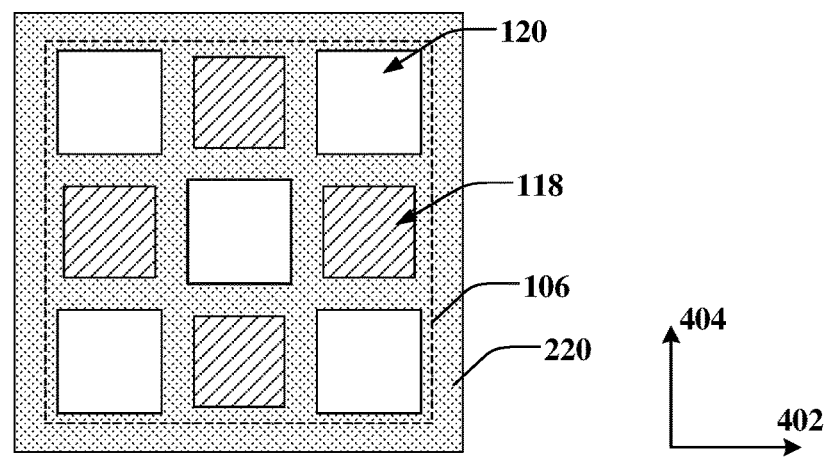

It will be appreciated that in various embodiments, the one or more dummy structures may have different shapes and/or configurations. FIGS. 8A-8C show several different embodiments of the disclosed one or more dummy structures.

As shown in top-view 800 of FIG. 8A, the one or more dummy gate structures 120 laterally contact the dummy epitaxial regions 118 along a first direction 402 and along a second direction 404. The one or more dummy gate structures 120 do not overlap and are directly adjacent to the dummy epitaxial regions 118, which extend between the one or more dummy gate structures 120, spacing the one or more dummy gate structures 120 from one another.

As shown in top-view 802 of FIG. 8B, the one or more dummy gate structures 120 and the dummy epitaxial regions 118 are spaced from one another by a surface of the substrate 108 that is outside of STI structures 220.

As shown in top-view 804 of FIG. 8C, the dummy epitaxial regions 118 and the one or more dummy gate structures 120 are each confined within a series of square areas in the dummy region 106. The square areas form a checkerboard pattern and do not overlap.

In some embodiments, topmost surfaces of the dummy epitaxial regions 118, the one or more dummy gate structures 120, and spaces in between the dummy epitaxial regions 118 and the one or more dummy gate structures 120 constitute a first area, and a percentage of the first area that is contributed by the topmost surface of the dummy epitaxial regions 118 exceeds 20%.

Figure 9A:
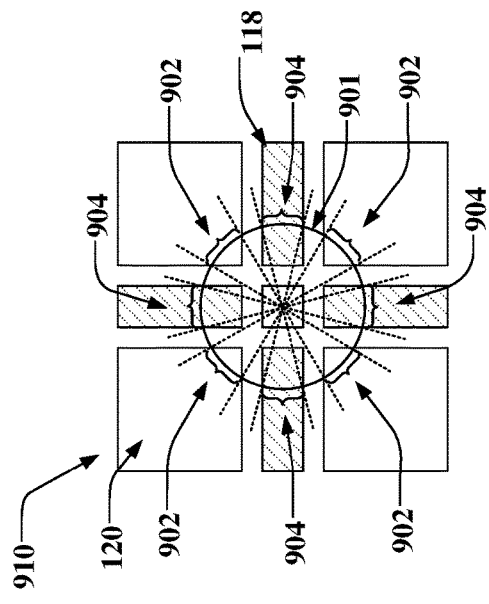
FIGS. 9A-9D illustrate some additional embodiments of an integrated chip structure having one or more dummy structures comprising dummy epitaxial regions.
Figure 9B:
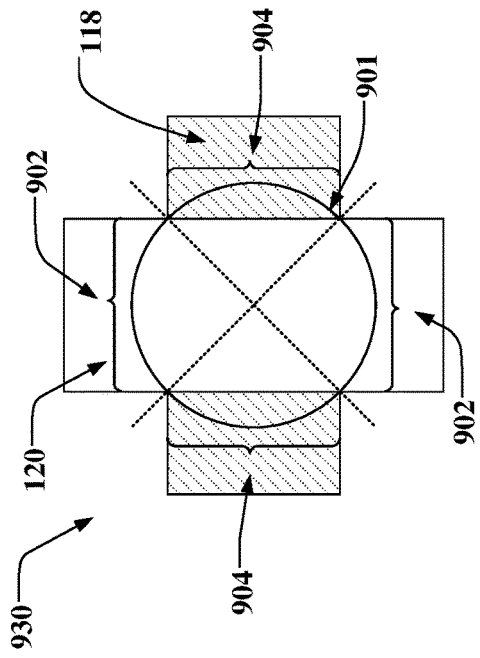
Figure 9C:
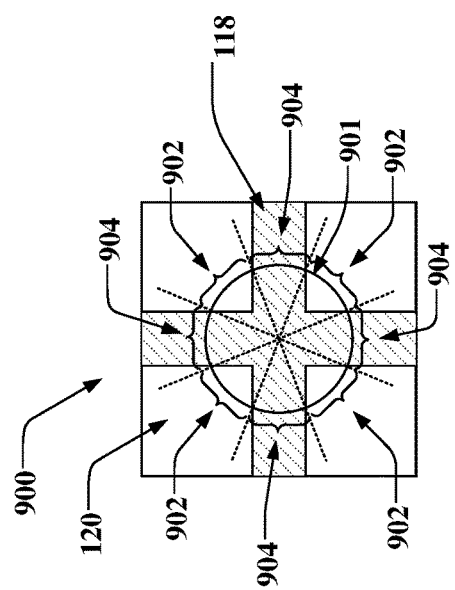
Figure 9D:
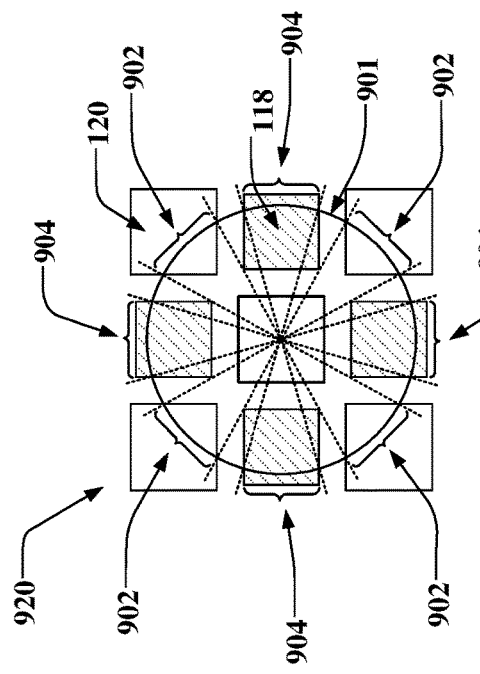

FIGS. 9A-9C show some embodiments of dummy structures 900, 910, and 920 corresponding to dummy structures disclosed in FIGS. 8A-8C in greater detail. FIG. 9D illustrates some embodiments of a dummy structure 930 corresponding to a dummy structure disclosed in FIG. 4A in greater detail. One feature that is similar between the dummy structures disclosed in FIGS. 9A-9D is that the dummy structures comprise one or more dummy gate structures 120 and dummy epitaxial regions 118. The dummy structures also have at least two-fold rotational symmetry, with the dummy structure disclosed in FIG. 8A having four-fold rotational symmetry.

In some embodiments, a circle 901 that is concentric with a center of respective dummy structures 900, 910, 920, and 930 has a first plurality of arcs 902 extending between outer sidewalls of the one or more dummy gate structures 120 and each having a first arc length. In some embodiments, there also exists a second plurality of arcs 904 of the circle 901 extending between outer sidewalls of the dummy epitaxial region 118 that each have a second length that is equal to the first length. In some embodiments, the first plurality of arcs 902 and the second plurality of arcs 904 do not overlap.

FIGS. 10-22 illustrate cross-sectional views 1000-2200 of some embodiments of an integrated chip structure having one or more dummy structures comprising dummy epitaxial regions. Although FIGS. 10-22 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 10:
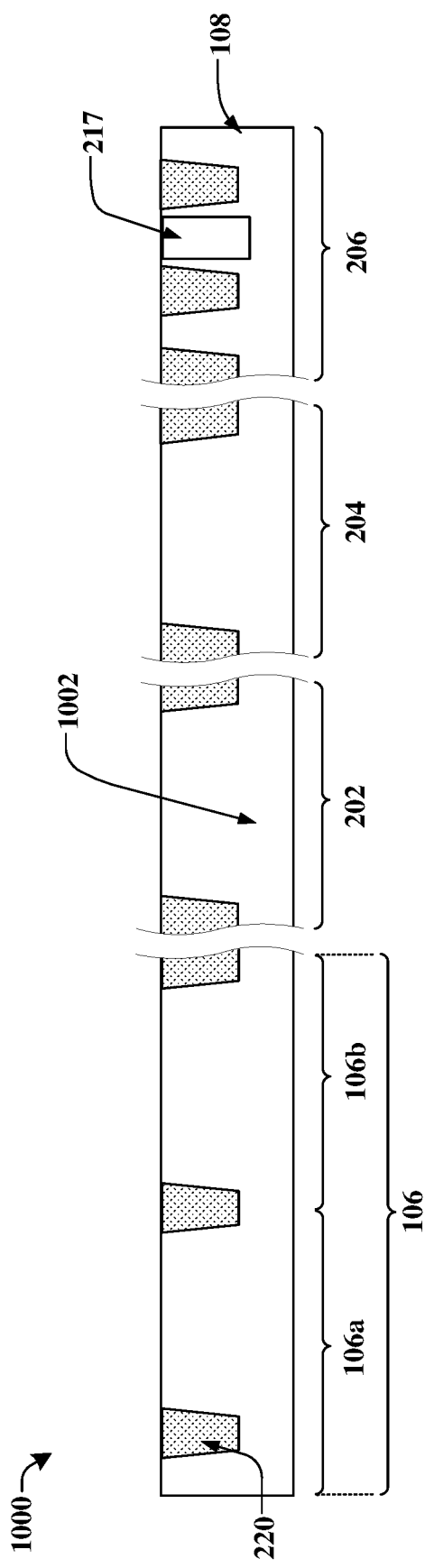

As shown in cross-sectional view 1000 of FIG. 10, one or more STI structures 220 are formed in a low voltage device region 202, a medium voltage device region 204, a high voltage device region 206, and a dummy region 106 of a substrate 108. The one or more STI structures 220 are configured to provide electrical isolation between devices within the different regions of the substrate 108. The STI structures 220 comprise a dielectric material (e.g., silicon oxide, silicon nitride, or other suitable materials) formed within a trench within the substrate 108. In some embodiments, the substrate 108 can be a bulk silicon substrate wafer, a semiconductor-on-insulator (SOI) substrate wafer (e.g., silicon on insulator substrate), or other suitable types of wafers. The one or more STI structures 220 may be formed by etching the substrate 108 to form a trench, followed by depositing the dielectric material within the trench. In some embodiments, a lightly doped well 1002 may be implanted into the low voltage device region 202. In some embodiments, an additional doped region 217 may be formed in the high voltage device region 206.

Figure 11:
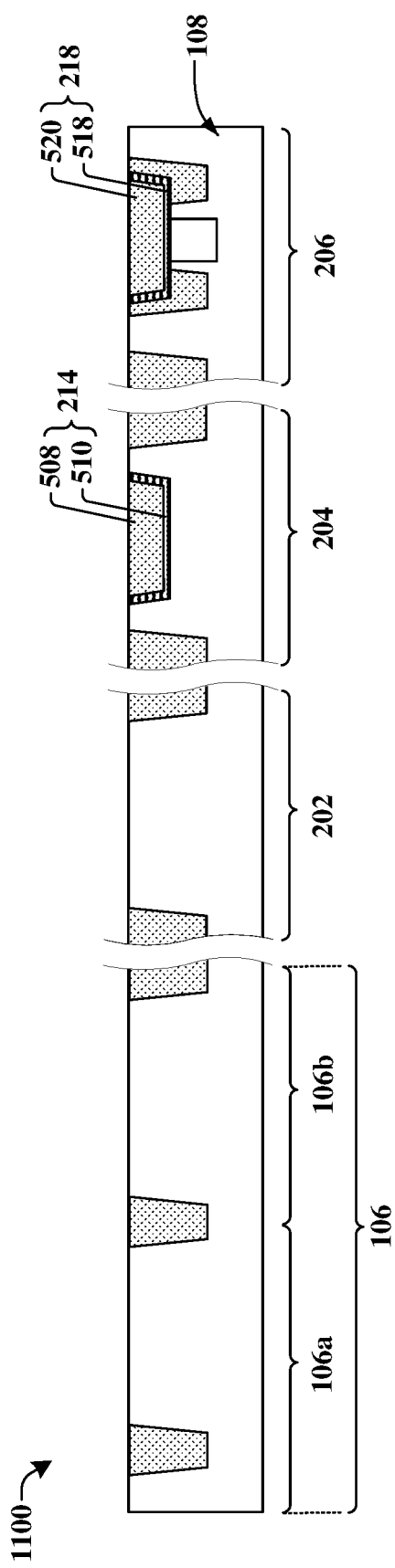

As shown in cross-sectional view 1100 of FIG. 11, a medium voltage gate structure 214 is formed within the medium voltage device region 204 and a high voltage gate structure 218 is formed within the high voltage device region 206. In some embodiments, the medium voltage gate structure 214 and the high voltage gate structure 218 are recessed gate structures that are formed by etching the substrate 108 to form recesses, forming a gate dielectric 510 and 518 over the substrate 108 and within the recesses, filling the rest of the recesses with a gate electrode 508 and 520, and removing excess of gate dielectric and gate electrode material from above an uppermost surface of the substrate 108 using a planarization process (e.g., a chemical mechanical planarization (CMP) process). In some embodiments, the gate dielectric 510 and 518 and the gate electrode 508 and 520 are each formed through a deposition process (e.g., a chemical vapor deposition (CVD) process, a plasma enhanced CVD (PE-CVD) process, a physical vapor deposition (PVD) process, an atomic layer deposition (ALD) process, etc.). In other embodiments, the gate dielectric 510 and 518 and the gate electrode 508 and 520 are formed using other suitable techniques.

Figure 12:
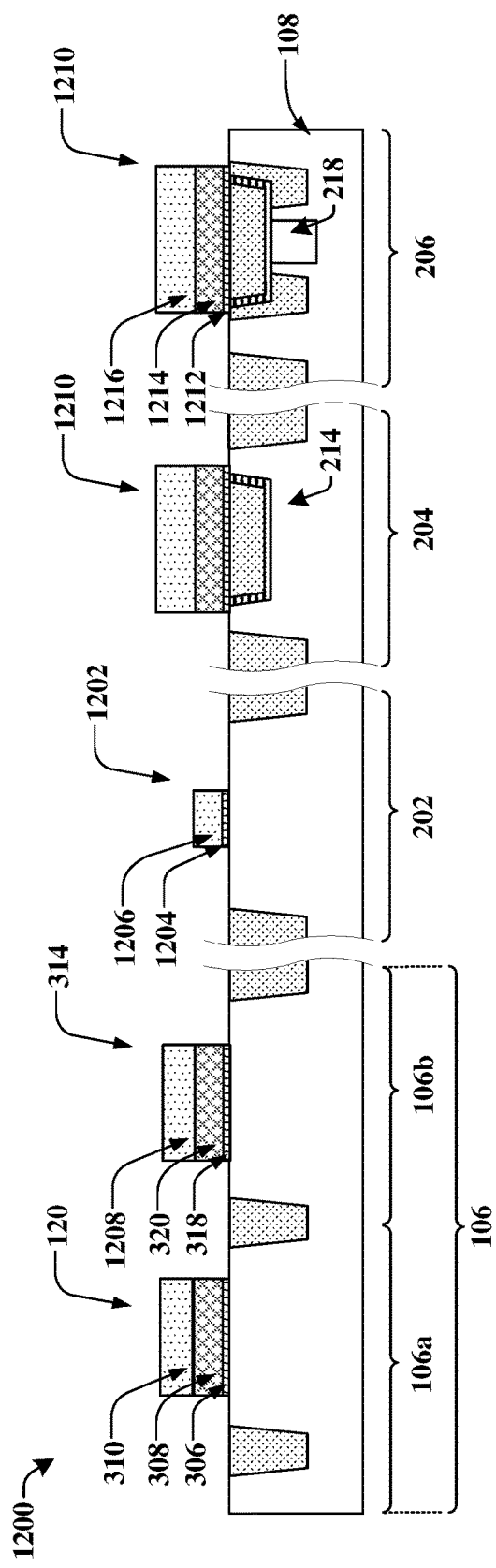

As shown in cross-sectional view 1200 of FIG. 12, one or more dummy gate structures 120 and one or more additional dummy gate structures 314 are formed within the dummy region 106, a sacrificial gate 1202 is formed within the low voltage device region 202, and intermediate protective stacks 1210 are formed within the medium voltage device region 204 and the high voltage device region 206. In some embodiments, the one or more dummy gate structures 120, the one or more additional dummy gate structures 314, the sacrificial gate 1202, and the intermediate protective stacks 1210 may be formed by depositing a first intermediate dielectric layer over the substrate 108, a second intermediate dielectric layer over the first intermediate dielectric layer, and an intermediate polysilicon layer over the second intermediate dielectric layer. The first intermediate dielectric layer, the second intermediate dielectric layer, and the intermediate polysilicon layer are subsequently patterned to form the one or more dummy gate structures 120, one or more additional dummy gate structures 314, the sacrificial gate 1202, and the intermediate protective stacks 1210. In some embodiments, the first intermediate dielectric layer, the second intermediate dielectric layer, and the intermediate polysilicon layer are formed using deposition processes (e.g., a CVD process, a PE-CVD process, a PVD process, an ALD process, etc.).

In some embodiments, the one or more dummy gate structures 120 are formed to have a first dielectric layer 306, a second dielectric layer 308, and a polysilicon layer 310, while the one or more additional dummy gate structures are formed to have a third dielectric layer 318, a fourth dielectric layer 320, and a second polysilicon layer 1208. In some embodiments, the sacrificial gate 1202 is formed to have a sacrificial polysilicon layer 1206 over a fifth dielectric layer 1204. In some embodiments, the intermediate protective stacks 1210 are formed to have a sixth dielectric layer 1212, a seventh dielectric layer 1214, and a third polysilicon layer 1216.

Figure 13:
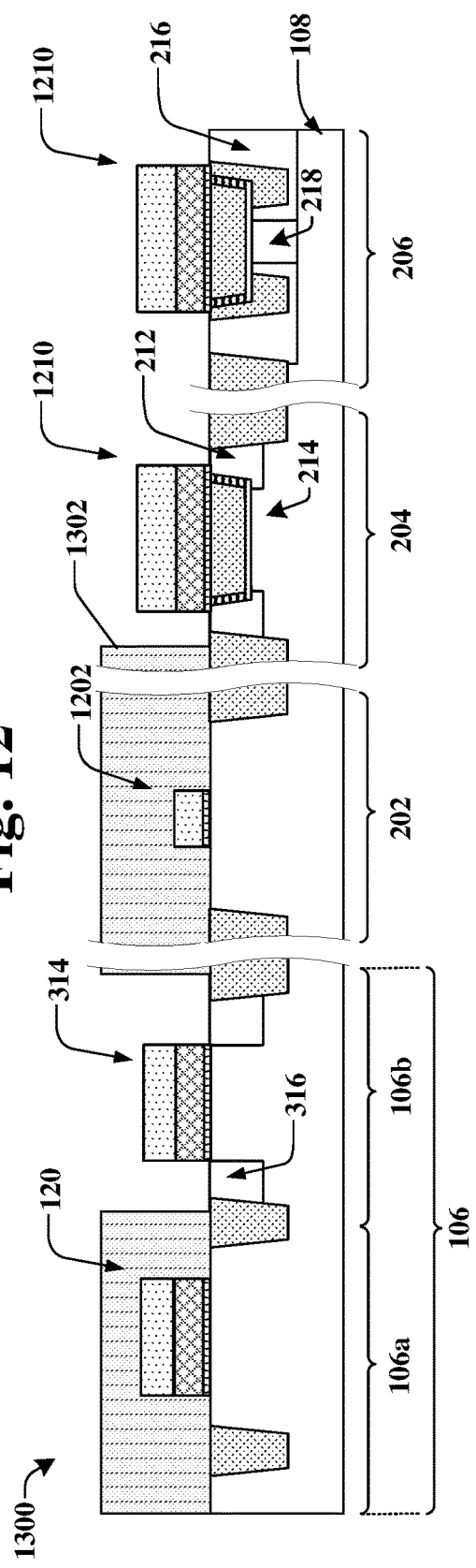

As shown in cross-sectional view 1300 of FIG. 13, implanted source/drain regions 212 and 216 are formed in the medium voltage device region 204 and the high voltage device region 206, respectively. The implanted source/drain regions 212 and 216 are formed through implanting dopants in the substrate 108 according to the intermediate protective stacks 1210, the one or more STI structures 220, and a mask 1302. In some embodiments, dummy doped regions 316 may also be formed within the second dummy region 106b on opposing sides of the one or more additional dummy gate structures 314. In some embodiments, the implanted source/drain regions 212 and 216 and/or the dummy doped regions 316 may be formed by one or more implantation processes.

Figure 14:
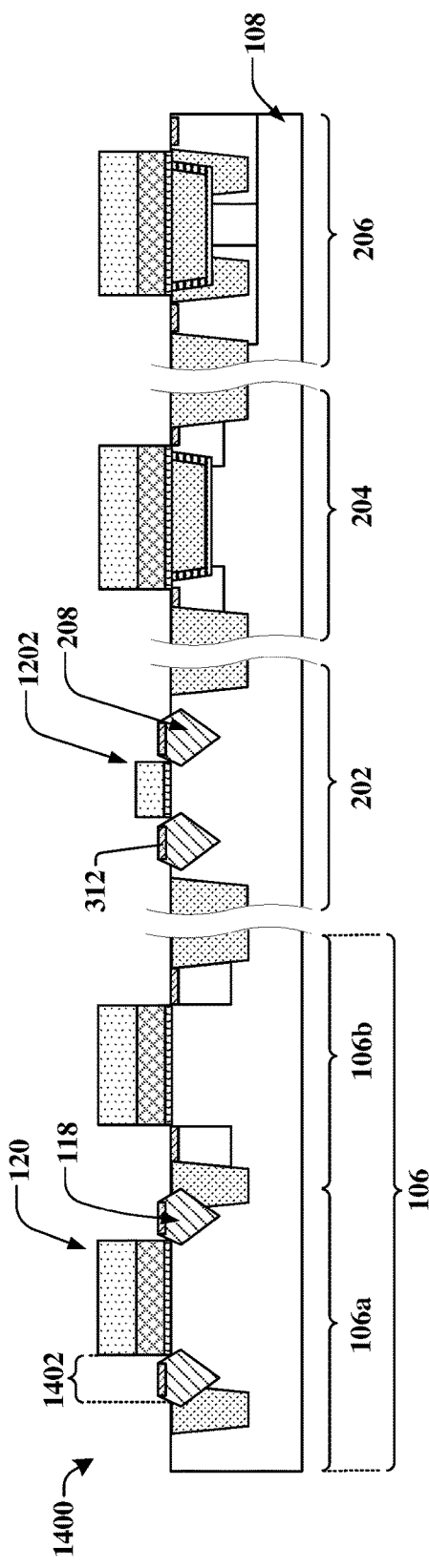

As shown in cross-sectional view 1400 of FIG. 14, epitaxial source/drain regions 208 are formed within the low voltage device region 202 and dummy epitaxial regions 118 are formed within the dummy region 106. The epitaxial source/drain regions 208 and the dummy epitaxial regions 118 are formed by etching the substrate 108 to form recesses 1402 and subsequently epitaxially growing an epitaxial material (e.g., SiGe) within the recesses 1402.

In some embodiments, a first salicidation process may be performed after the epitaxial source/drain regions 208 and the dummy epitaxial regions 118 are formed. The first salicidation process forms a first silicide 312 over the epitaxial source/drain regions 208, the dummy epitaxial regions 118, the implanted source/drain regions 212 within the medium voltage device region 204, and the implanted source/drain regions 216 within the high voltage device region 206. The first silicide 312 is formed by depositing a metal, heating the integrated chip structure to integrate the metal into the exposed regions of the substrate 108 and epitaxial material, and etching the remaining metal off of the substrate 108.

Figure 15:
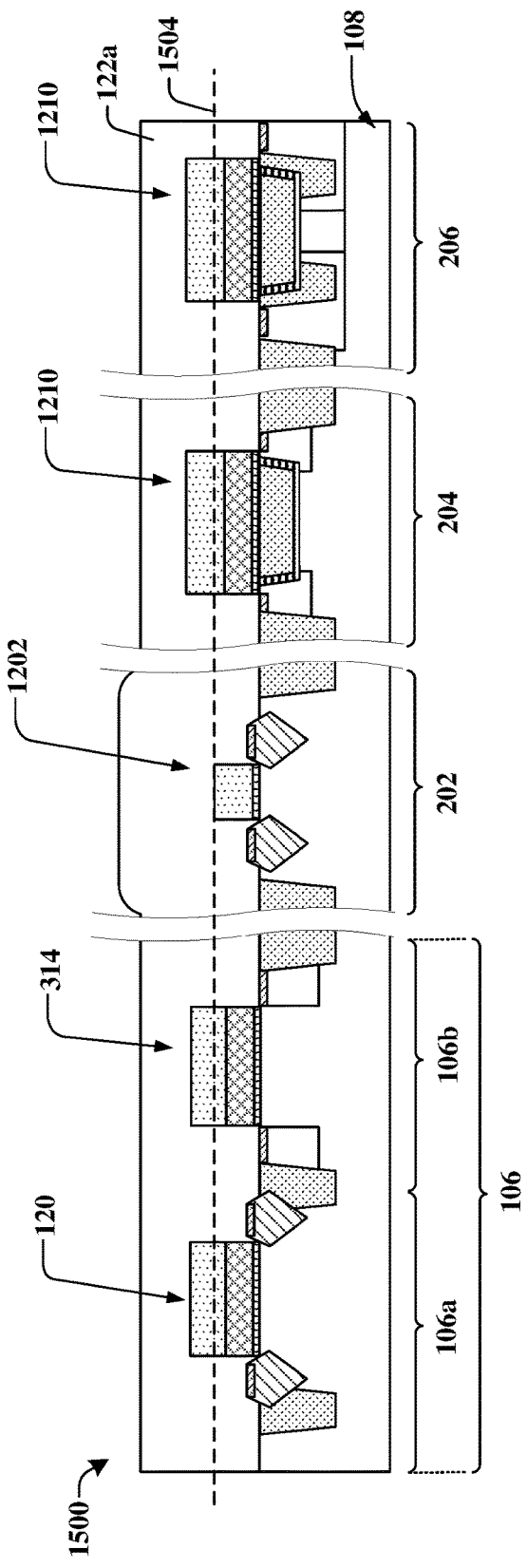

As shown in cross-sectional view 1500 of FIG. 15, a first inter-level dielectric (ILD) layer 122a is formed over the substrate 108, and a planarization process (e.g., a CMP process performed along line 1504) is used to level the first ILD layer 122a to a top surface of the sacrificial gate 1202 of the low voltage device region 202. In some embodiments, the planarization process may remove parts of the polysilicon layers. The planarization process results in the first ILD layer 122a being left around the one or more dummy gate structures 120, the one or more additional dummy gate structures 314, the sacrificial gate 1202, and the intermediate protective stacks 1210.

Figure 16:
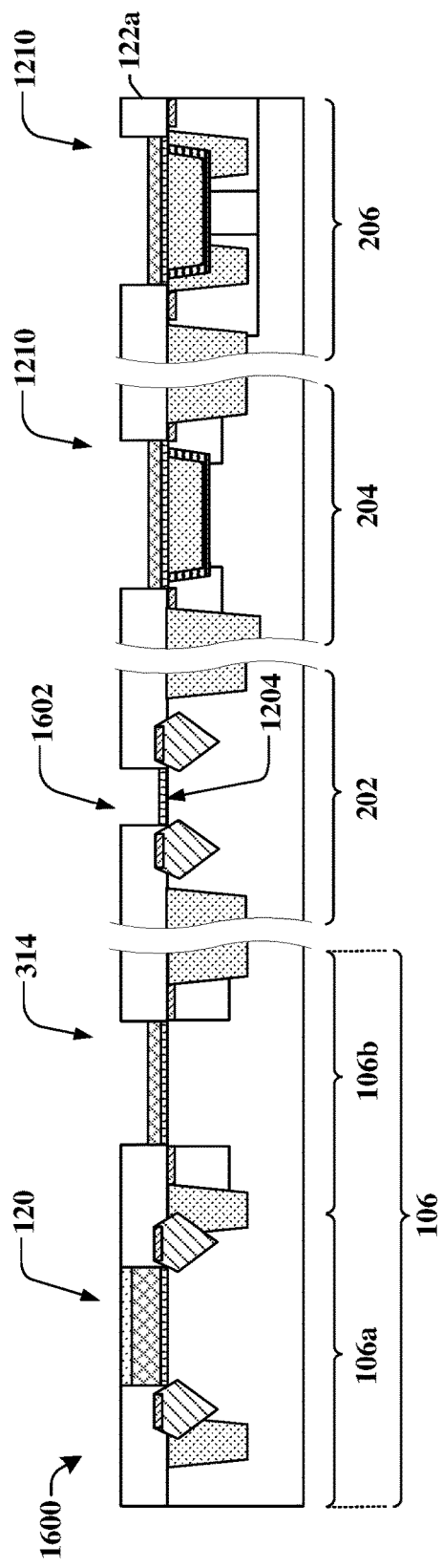

As shown in cross-sectional view 1600 of FIG. 16, the sacrificial polysilicon layer is removed from the sacrificial gate, leaving a replacement gate cavity 1602. In some embodiments, the replacement gate cavity 1602 extends from a top of the first ILD layer 122a to a top of the fifth dielectric layer 1204. In some embodiments, the fifth dielectric layer 1204 may also be removed from the sacrificial gate. In some embodiments, the polysilicon may be removed by an etching process. In some embodiments, the etching process may also remove parts of the second polysilicon layer and the fourth dielectric layer from within the one or more additional dummy gate structures 314 and parts of the third polysilicon layer and the seventh dielectric layer from within the intermediate protective stacks 1210. In such embodiments, the etching process recesses the one or more additional dummy gate structures 314 and the intermediate protective stacks 1210 below a top of the first ILD layer 122a.

Figure 17:
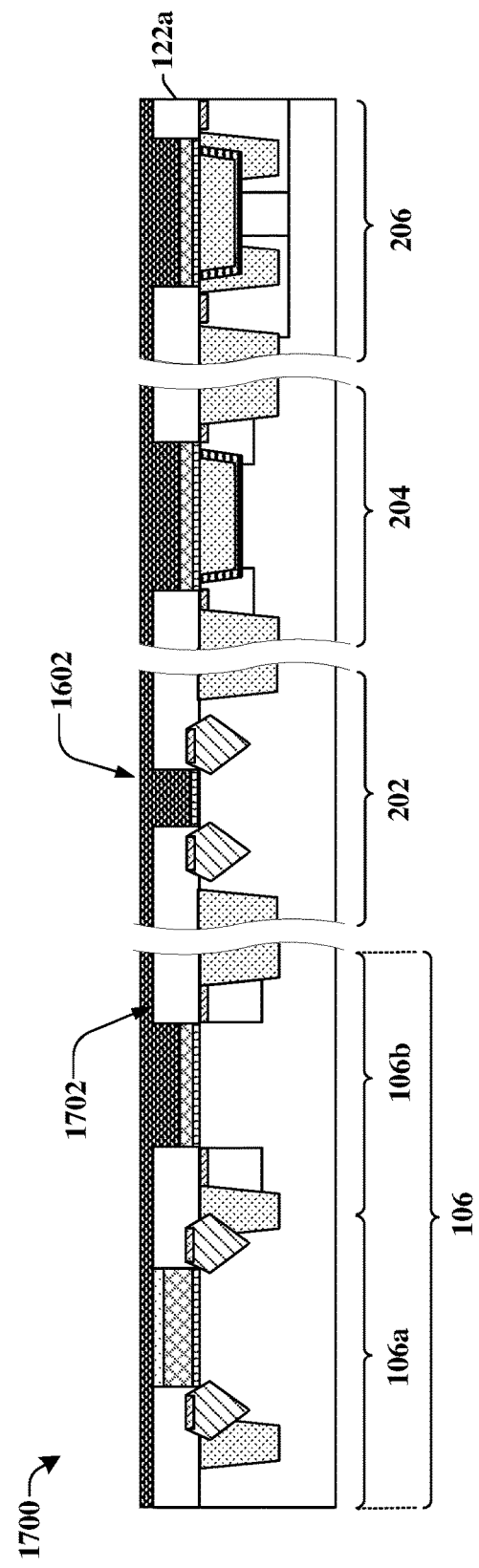

As shown in cross-sectional view 1700 of FIG. 17, replacement metal 1702 is formed over the substrate 108 to fill the replacement gate cavity 1602. In some embodiments, the replacement metal 1702 may comprise tungsten (W), aluminum (Al), copper (Cu), titanium (Ti), cobalt (Co), nickel (Ni) rubidium (Ru), titanium nitride (TiN), tantalum nitride (TaN), tantalum aluminum nitride (TaAlN), polysilicon, or other suitable materials. The replacement metal 1702 is formed using CVD, ALD, or another suitable process.

As shown in cross-sectional view 1800 of FIG. 18, the replacement metal 1702 is removed from over a top surface of the first ILD layer 122a. In some embodiments, the replacement metal 1702 may be removed through a planarization process (e.g., CMP process). This results in the metal gate electrode 502 remaining between inner sidewalls of the first ILD layer 122a. In some embodiments, an etch back process may be subsequently performed to remove metal from the replacement metal gate from over the one or more additional dummy gate structures 314 and the intermediate protective stacks 1210.

As shown in cross-sectional view 1900 of FIG. 19, a hard mask patterning step is performed to remove a portion of the intermediate protective stacks (e.g., 1210 of FIG. 18) directly over the medium voltage gate structure 214 and directly over the high voltage gate structure 218. In order to do this, a second mask 1902 is formed over the dummy region 106, the low voltage device region 202, and parts of the intermediate protective stacks that overlie outer edges of the medium voltage gate structure 214 and directly over the high voltage gate structure 218. The intermediate protective stacks are subsequently exposed to a second etchant 1904 according to the second mask 1902 to form protective stacks 512 having a first protective stack dielectric layer 514 and a second protective stack dielectric layer 516.

As shown in cross-sectional view 2000 of FIG. 20, a second salicidation process is performed to form a second silicide 313 on the medium voltage gate structure 214 and the high voltage gate structure 218. In some embodiments, the second salicidation process may be performed in a manner that is similar and/or the same as the first salicidation process described in conjunction with FIG. 14.

As shown in cross-sectional view 2100 of FIG. 21, a second ILD layer 122b is formed over the first ILD layer 122a. A first plurality of conductive interconnects 124a are formed within the first ILD layer 122a and/or the second ILD layer 122b. In some embodiments, the first plurality of conductive interconnects 124a may be formed using a damascene process (e.g., a single damascene process or a dual damascene process). The damascene process is performed by forming the second ILD layer 122b over the substrate 108, etching the first ILD layer 122a and/or the second ILD layer 122b to form a hole and/or a trench, and filling the hole and/or trench with a conductive material. In some embodiments, the second ILD layer 122b may comprise USG, BPSG, FSG, PSG, BSG, or the like, formed by a deposition technique (e.g., PVD, CVD, PE-CVD, ALD, etc.), In some embodiments, the conductive material may comprise tungsten, copper, aluminum, copper, or the like, formed using a deposition process and/or a plating process (e.g., electroplating, electro-less plating, etc.).

Figure 22:
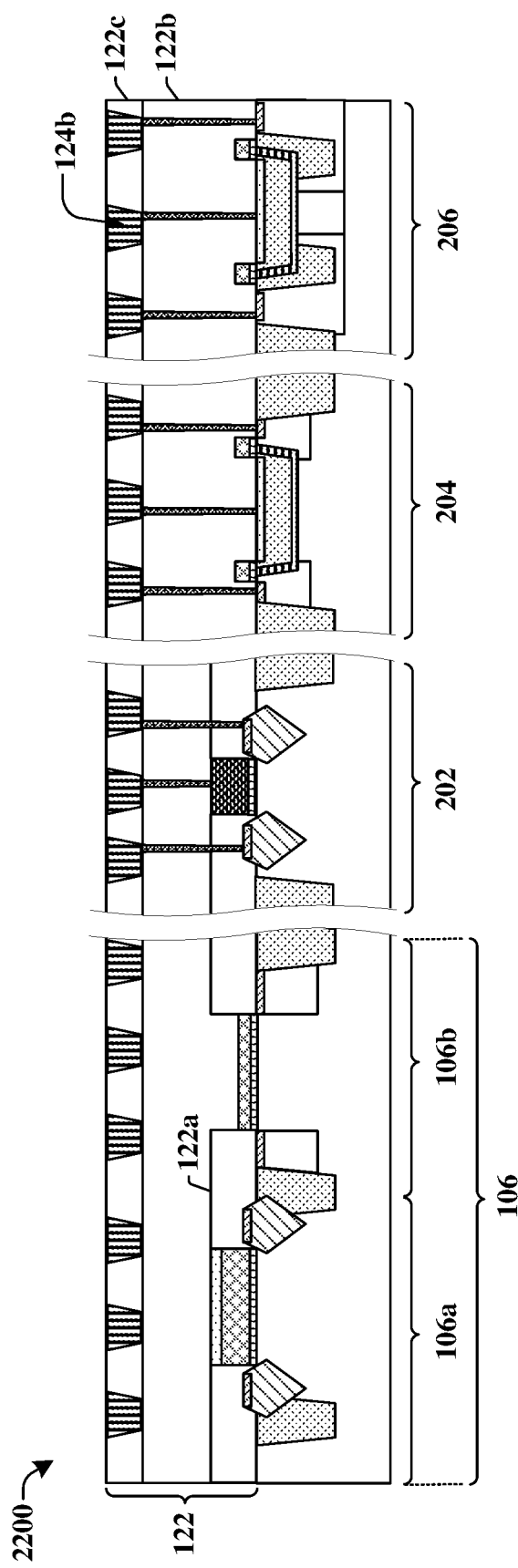

As shown in cross-sectional view 2200 of FIG. 22, a third ILD layer 122c is formed over the second ILD layer 122b. A second plurality of conductive interconnects 124b are formed within the third ILD layer 122c. In some embodiments, the second plurality of conductive interconnects 124b may be formed using a damascene process (e.g., a single damascene process or a dual damascene process). The damascene process is performed by forming the third ILD layer 122c over the substrate 108, etching the third ILD layer 122c to form a hole and/or a trench, and filling the hole and/or trench with a conductive material. In some embodiments, the third ILD layer 122c may comprise USG, BPSG, FSG, PSG, BSG, or the like, formed by a deposition technique (e.g., PVD, CVD, PE-CVD, ALD, etc.), In some embodiments, the conductive material may comprise tungsten, copper, aluminum, copper, or the like, formed using a deposition process and/or a plating process (e.g., electroplating, electro-less plating, etc.).

Figure 23:
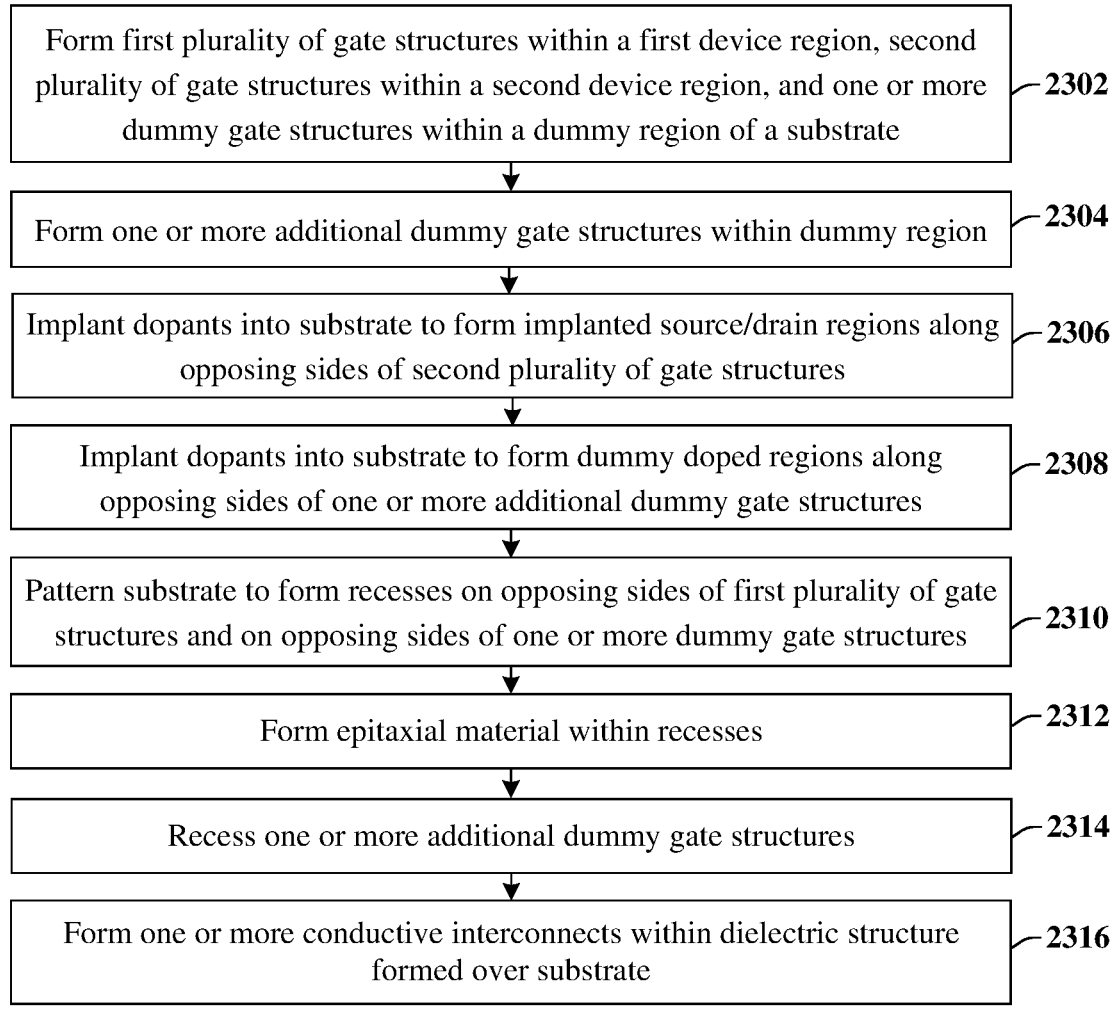
FIG. 23 illustrates a methodology in flowchart format of some additional embodiments of a method of forming an integrated chip structure having one or more dummy structures comprising dummy epitaxial regions.

FIG. 23 illustrates a methodology 2300 of forming an integrated chip structure in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2302, a first plurality of gate structures are formed within a first device region, a second plurality of gate structures are formed within a second device region, and one or more dummy gate structures are formed within a dummy region of a substrate. FIGS. 11-12 illustrate cross-sectional views 1100-1200 of some embodiments corresponding to act 2302.

At act 2304, one or more additional dummy gate structures are formed within the dummy region. FIG. 12 illustrates a cross-sectional view 1200 of some embodiments corresponding to act 2304.

At act 2306, dopants are implanted into the substrate to form implanted source/drain regions along opposing sides of the second plurality of gate structures. FIG. 13 illustrates a cross-sectional view 1200 of some embodiments corresponding to act 2306.

At act 2308, dopants are implanted into the substrate to form dummy doped regions along opposing sides of the one or more additional dummy gate structures. FIG. 13 illustrates a cross-sectional view 1300 of some embodiments corresponding to act 2308.

At act 2310, the substrate is patterned to form recesses on opposing sides of first plurality of gate structures and on opposing sides of the one or more dummy gate structures. FIG. 14 illustrates a cross-sectional view 1400 of some embodiments corresponding to act 2310.

At act 2312, epitaxial material is formed within the recesses. FIG. 14 illustrates a cross-sectional view 1400 of some embodiments corresponding to act 2312.

At act 2314, the one or more additional dummy gate structures are recessed. FIG. 16 illustrates a cross-sectional view 1600 of some embodiments corresponding to act 2314.

At act 2316, conductive interconnects are formed within a dielectric structure formed over the substrate. FIGS. 20-21 illustrate cross-sectional views 2000-2100 of some embodiments corresponding to act 2316.

Therefore, the present disclosure relates to an integrated chip structure that comprises one or more dummy structures having epitaxial regions that are configured to increase an overall epitaxial pattern density of the integrated chip structure to above a minimum epitaxial pattern density (e.g., approximately 5.2%) used in health epitaxial growth processes.

In some embodiments, the present disclosure relates to an integrated chip structure. The integrated chip structure includes a substrate having a first device region and a second device region; a plurality of first transistor devices disposed in the first device region and respectively having epitaxial source/drain regions disposed on opposing sides of a first gate structure, the epitaxial source/drain regions including an epitaxial material; a plurality of second transistor devices disposed in the second device region and respectively having implanted source/drain regions disposed on opposing sides of a second gate structure; and a dummy region including one or more dummy structures, the one or more dummy structures having dummy epitaxial regions including the epitaxial material.

In other embodiments, the present disclosure relates to an integrated chip structure. The integrated chip structure includes a first device region having a plurality of first devices disposed within a substrate, the plurality of first devices including epitaxial source/drain regions; a second device region having a plurality of second devices disposed within the substrate, the plurality of second devices including implanted source/drain regions; a dummy region having an array of dummy epitaxial regions and dummy gate structures arranged in a plurality of rows extending in a first direction and a plurality of columns extending in a second direction; and a first row of the plurality of rows alternates between one of the dummy epitaxial regions and one of the dummy gate structures along the first direction and a closest neighboring second row of the plurality of rows alternates between one of the dummy epitaxial regions and one of the dummy gate structures along the first direction, the dummy epitaxial regions in the first row being laterally offset from the dummy epitaxial regions in the second row by a non-zero distance.

In yet other embodiments, the present disclosure relates to a method of forming an integrated chip structure. The integrated chip structure includes forming a first plurality of gate structures within a first device region of a substrate; forming a second plurality of gate structures within a second device region of the substrate; forming one or more dummy gate structures within a dummy region of the substrate; implanting dopants into the substrate to form implanted source/drain regions along opposing sides of the second plurality of gate structures; patterning the substrate to form recesses on opposing sides of the first plurality of gate structures and on opposing sides of the one or more dummy gate structures; and forming epitaxial material within the recesses.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip structure, the method comprising:
    forming a first gate structures within a first device region of a substrate;
    forming a second gate structures within a second device region of the substrate;
    forming a first dummy gate structures within a dummy region of the substrate;
    forming an intermediate protective stack over the first gate structure concurrent with forming the first dummy gate structure, wherein the intermediate protective stack comprises a first dielectric layer and a polysilicon layer;
    implanting dopants into the substrate to form implanted source/drain regions along opposing sides of the first gate structures;
    patterning the substrate to form recesses on opposing sides of the second gate structure and on opposing sides of the first dummy gate structure; and
    forming epitaxial material within the recesses.

2. The method of claim 1, wherein the first device region comprises a high voltage device region and the second device region comprises a low voltage device region.

3. The method of claim 1, wherein the forming the second gate structures further comprises:
    forming a gate dielectric over the substrate; and
    forming a sacrificial gate over the gate dielectric.

4. The method of claim 3, further comprising:
    removing the sacrificial gate after forming the epitaxial material in the recesses, exposing an upper surface of the gate dielectric; and
    forming a gate electrode on the exposed upper surface of the gate dielectric.

5. The method of claim 1, wherein the intermediate protective stack and the first dummy gate structure are formed by:
    depositing a conformal dielectric layer over the substrate;
    depositing a conformal polysilicon layer over the conformal dielectric layer; and
    patterning the conformal dielectric layer and the conformal polysilicon layer, resulting in the intermediate protective stack and the first dummy gate structure remaining on the substrate.

6. A method of forming an integrated chip structure, the method comprising:
    forming shallow trench isolation (STI) structures in a low voltage device region, a medium voltage device region, a high voltage device region, and a dummy region of a substrate;
    forming a first gate structure in the medium voltage device region and a second gate structure in the high voltage device region, wherein outer sidewalls of the second gate structure are directly over the STI structures in the high voltage device region;
    forming a first dummy gate structure in the dummy region, and forming a sacrificial gate in the low voltage device region;
    doping the substrate to form source/drain regions surrounding the first gate structure and the second gate structure; and
    etching the substrate and epitaxially growing epitaxial source/drain regions on opposing sides of both the sacrificial gate and the first dummy gate structure;
    wherein the first gate structure and the second gate structure are formed by:
        etching openings into a first side of the substrate within the medium voltage device region and the high voltage device region, and
        filling the openings by forming first gate dielectrics and first gate electrodes within the openings; and
    wherein the first dummy gate structure is formed by:
        forming a first intermediate dielectric layer and a first intermediate polysilicon layer over the first side of the substrate, and
        patterning the first intermediate dielectric layer and the first intermediate polysilicon layer to remove portions not corresponding to the first dummy gate structure.

7. The method of claim 6, wherein the source/drain regions surrounding the first gate structure are between the first gate structure and the STI structures, and wherein the source/drain regions surrounding the second gate structure are spaced from outer sidewalls of the second gate structure by the STI structures.

8. The method of claim 6, wherein the epitaxial source/drain regions comprise silicon and germanium.

9. The method of claim 6, wherein the epitaxial source/drain regions comprise silicon carbide.

10. The method of claim 6, further comprising performing a salicidation process after the epitaxial source/drain regions are formed, comprising:
    depositing a metal onto the epitaxial source/drain regions and the source/drain regions, heating the metal to integrate the metal into exposed surfaces of the epitaxial source/drain regions and the source/drain regions, and removing the metal overlying the epitaxial source/drain regions and the source/drain regions.

11. A method of forming an integrated chip structure, the method comprising:

forming a first gate structure within a first device region of a substrate;

forming a second gate structure within a second device region of the substrate;

forming a first dummy gate structure within a dummy region of the substrate;

implanting dopants into the substrate to form implanted source/drain regions along opposing sides of the first gate structure;

growing epitaxial source/drain regions on opposing sides of the second gate structure and on opposing sides of the first dummy gate structure; and forming an additional doped region before forming the first gate structure, and wherein the implanted source/drain regions along the opposing sides of the first gate structure are separated by the additional doped region.

12. The method of claim 11, further comprising patterning the substrate to form recesses on the opposing sides of the second gate structure and on the opposing sides of the first dummy gate structure, wherein the epitaxial source/drain regions are grown within the recesses.

13. The method of claim 11, wherein the epitaxial source/drain regions on the opposing sides of the first dummy gate structure comprise a first epitaxial source/drain region on a first side of the first dummy gate structure and a second epitaxial source/drain region on a second side of the first dummy gate structure, wherein the first epitaxial source/drain region is spaced from the second epitaxial source/drain region by the first dummy gate structure.

14. The method of claim 11, further comprising:

forming a mask over the second device region and the first dummy gate structure before implanting the dopants to form the implanted source/drain regions; and removing the mask over the second device region and the first dummy gate structure after implanting the dopants to form the implanted source/drain regions.

15. The method of claim 11, wherein forming the first dummy gate structure further comprises:

forming a first dielectric layer over the substrate;

forming a second dielectric layer onto the first dielectric layer;

forming a polysilicon layer onto the second dielectric layer; and patterning the first dielectric layer, the second dielectric layer, and the polysilicon layer to form the first dummy gate structure.

16. The method of claim 15, wherein forming the first dummy gate structure further comprises:

etching the substrate around the first dielectric layer, the second dielectric layer, and the polysilicon layer to form two recesses within the substrate separated by the first dummy gate structure; and epitaxially growing two dummy epitaxial regions that are separated by the first dummy gate structure and extend to outer sidewalls of the first dummy gate structure.

17. The method of claim 11, wherein forming the second gate structure further comprises:

forming a sacrificial gate structure concurrent with forming the first dummy gate structure; and removing a portion of the sacrificial gate structure after growing the epitaxial source/drain regions, resulting in remaining portions of the sacrificial gate structure remaining on the substrate; and forming the second gate structure comprising a metal gate and the remaining portions of the sacrificial gate structure.

18. The method of claim 11, further comprising:

forming a third gate structure in a third device region of the substrate concurrent with forming the first gate structure; and forming second implanted source/drain regions surrounding the third gate structure, the second implanted source/drain regions contacting outer sidewalls of the third gate structure.

19. The method of claim 18, further comprising:

forming a plurality of shallow trench isolation (STI) structures within the first device region, the second device region, and the third device region before forming the first gate structure;

wherein STI structures in the third device region are spaced from the third gate structure by the substrate; and wherein STI structures in the first device region space outer sidewalls of the first gate structure from the substrate.

20. The method of claim 6, wherein the sacrificial gate is formed concurrent with forming the first dummy gate structure.

* * * * *